(12) United States Patent
Sakata

(10) Patent No.: US 6,350,629 B1
(45) Date of Patent: Feb. 26, 2002

(54) OPTICAL SEMICONDUCTOR DEVICE HAVING ACTIVE LAYER AND CARRIER RECOMBINATION LAYER DIFFERENT FROM EACH OTHER

(75) Inventor: Yasutaka Sakata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/386,873

(22) Filed: Aug. 31, 1999

(30) Foreign Application Priority Data

Sep. 2, 1998 (JP) .......................................... 10-248217

(51) Int. Cl.⁷ .............................. H01L 21/00; H01S 5/00
(52) U.S. Cl. .............................. 438/44; 438/46; 372/43; 372/44
(58) Field of Search .............................. 438/39, 40, 44; 372/43–50

(56) References Cited

U.S. PATENT DOCUMENTS

| | | | | |
|---|---|---|---|---|
| 4,949,352 A | * | 8/1990 | Plumb | 372/46 |
| 5,179,040 A | * | 1/1993 | Hattori | 438/32 |
| 5,521,994 A | * | 5/1996 | Takeuchi et al. | 385/14 |
| 5,872,022 A | * | 2/1999 | Motoda et al. | 438/39 |
| 6,222,867 B1 | * | 4/2001 | Inomoto et al. | 372/50 |

FOREIGN PATENT DOCUMENTS

| | | | |
|---|---|---|---|
| JP | 58-31592 | 2/1983 | |
| JP | 62-102583 | 5/1987 | |
| JP | 01082684 | 3/1989 | |
| JP | 3-54883 | 3/1991 | |
| JP | 406085394 A | * 9/1992 | 372/49 |
| JP | 4-317384 | 11/1992 | |
| JP | 8-213691 | 8/1996 | |
| JP | 8-236858 | 9/1996 | |
| JP | 8-330676 | 12/1996 | |
| JP | 9-167874 | 6/1997 | |
| JP | 9-266349 | 10/1997 | |
| JP | 10-93190 | 4/1998 | |

OTHER PUBLICATIONS

Mito, I. et al., "Double–Channel Planar Buried–Heterostructure Laser Diode with Effective Current Confinement", Electronics Letters, Oct. 28, 1982, vol. 18, No. 22, pp. 953–954.

Sakata, Y. et al., "Low Threshold and High Uniformity for Novel 1.3–$\mu$m–Strained InGaAsP MQW DC–PBH LD's Fabricated by the All–Selective MOVPE Technique", IEEE, Photonics Tech Letters, vol. 9, No. 3, Mar. 1997, pp. 291–293.

Sakata, Y. et al., "All–Selective MOVPE–Grown 1.3–$\mu$m–Strained Multi–Quantum–Well Buried–Heterostructure Laser Diodes", IEEE Journal of Quantum Electronics, vol. 35, No. 3, pp. 368–376, Mar. 1999.

* cited by examiner

Primary Examiner—Eddie Lee
Assistant Examiner—Paul E Brock, II
(74) Attorney, Agent, or Firm—Hutchins, Wheeler & Dittmar

(57) ABSTRACT

In an optical semiconductor device including a semiconductor substrate, an active layer formed on the semiconductor substrate, a pnpn-type current blocking layer formed on a side of the active layer, and a carrier recombination layer on the semiconductor substrate on the side of the active layer, a structure of the active layer is different from a structure of the carrier recombination layer.

2 Claims, 27 Drawing Sheets

OPTICAL SEMICONDUCTOR DEVICE HAVING ACTIVE LAYER AND CARRIER RECOMBINATION LAYER DIFFERENT FROM EACH OTHER

BACKGROUND OF THE INVENTION

1. Field of the Invention

The present invention relates to an optical semiconductor device such as a double-channel planer buried heterostructured (DC-PBH) semiconductor laser device.

2. Description of the Related Art

Generally, in a DC-PBH semiconductor laser device, in order to reduce a leakage current (invalid current) at a high temperature or in a high bias condition, a current blocking structure using a pnpn-type thyristor-structure has been adopted. However, in such a pnpn-type thyristor-structure, carrier recombination at a high bias condition charges up the thyristor to turn it ON (see JP-A-102583; I. Mito et al., "Double-channel Planar Buried-Heterostructure Laser Diode With Effective Current Confinement", Electronics Lett., Vol. 18, No. 22, pp. 953–954, October 1982; and Y. Sakata et al., "Low Threshold and High Uniformity for Novel 1.3 μm-strained InGaAsP MQW DC-PBH LD's Fabricated by the All-Selected MOVPE Technique", IEEE photonicsTech. Lett, Vol. 9, No. 3, pp. 291–293, March 1997).

In order to avoid the above-mentioned latch-up phenomenon in the pnpn-type thyristor-structure, a carrier recombination layer has been provided in the DC-PBH semiconductor laser device.

For example, in a first prior art semiconductor laser device (see JP-A-8-213691) including an InGaAsP active layer, a p-type InP buried layer, an n-type InP current blocking layer, a semi-insulating InP current blocking layer and an n-type InP buried layer, an InGaAsP carrier recombination is provided between the semi-insulating InP layer and the n-type InP buried layer.

In a second prior art semiconductor laser device (see JP-A-8-236858) including an InGaAsP active layer, an n-type InP current blocking layer and a p-type InP current blocking layer, an i-type InGaAsP carrier recombination layer is provided on the p-type InP current blocking layer.

In a third prior art semiconductor laser device (see JP-A-9-167874) including an InGaAsP bulk or quantum well structured active layer, a p-type InP buried layer, an n-type current blocking layer and a p-type current blocking layer, an In GaAsP carrier recombination layer is provided on the p-type InP current blocking layer.

In a fourth prior art semiconductor laser device (see JP-A-9-266349) including a multiple quantum well (MQW) active layer, a p-type InP buried layer, an n-type current blocking layer, a p-type current blocking layer and an n-type InP buried layer, an MQW carrier recombination layer is provided between the p-type InP current blocking layer and the n-type InP buried layer.

In a fifth prior art semiconductor laser device (see JP-A-10-93190) including an MQW active layer, a p-type InP current blocking layer and an n-type InP current blocking layer, an MQW carrier recombination layer is provided beneath the n-type InP current blocking layer.

In the above-described prior art semiconductor laser devices, however, since the structure of the carrier recombination layer is the same as that of the active layer, the invalid current consumed in the carrier recombination layer is increased as compensation to suppress the turning ON operation of the thyristor structure, thus increasing the consumption power at a high temperature and at a high bias condition.

SUMMARY OF THE INVENTION

It is an object of the present invention to provide an optical semiconductor device such as a semiconductor laser device capable of reducing the invalid current.

According to the present invention, in an optical semiconductor device including a semiconductor substrate, an active layer formed on the semiconductor-substrate, a pnpn-type current blocking layer formed on a side of the active layer, and a carrier recombination layer on the semiconductor substrate on the side of the active layer, a structure of the active layer is different from a structure of the carrier recombination layer. For example, the active layer is constructed by an MQW structure, and the carrier recombination layer is constructed by an i-type InGaAsP layer.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

FIG. 1A through 1G are cross-sectional views for explaining a first embodiment of the method for manufacturing a semiconductor laser device according to the present invention.

Figure 1A:
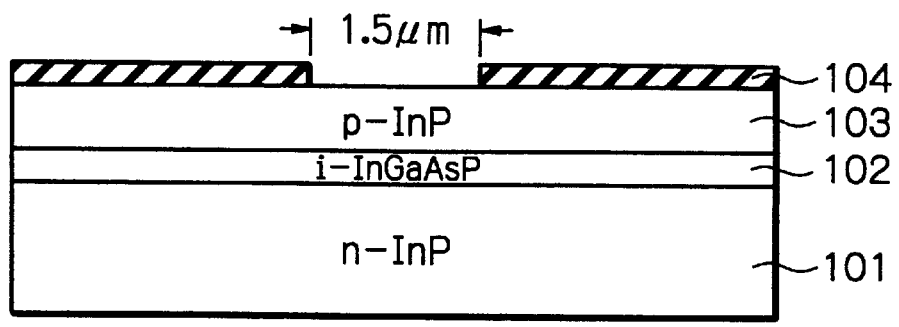
FIGS. 1A through 1G are cross-sectional views for explaining a first embodiment of the method for manufacturing a semiconductor laser device according to the present invention.

First, referring to FIG. 1A, an about 0.10 μm thick i-type InGaAsP carrier recombination layer 102 having a bandgap wavelength of about 1.20 μm and a p-type InP layer 103 are sequentially grown by a metal-organic vapor phase epitaxy (MOVPE) process on a (100) n-type InP substrate 101. Then, a silicon dioxide layer is deposited by a chemical vapor deposition (CVD) process on the entire surface, and the silicon dioxide layer is patterned by a photolithography and etching process. As a result, a silicon dioxide pattern 104 having an about 1.5 μm wide-striped space is formed along the direction [011] of the n-type InP substrate 101.

Figure 1B:
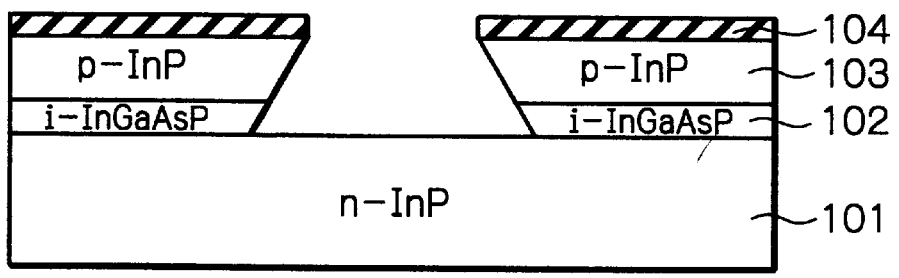

Next, referring to FIG. 1B, the P-type InP layer 103 and the i-type InGaAsP carrier recombination layer 102 are etched by a wet etching process using the silicon dioxide pattern 104 as a mask.

Figure 1C:
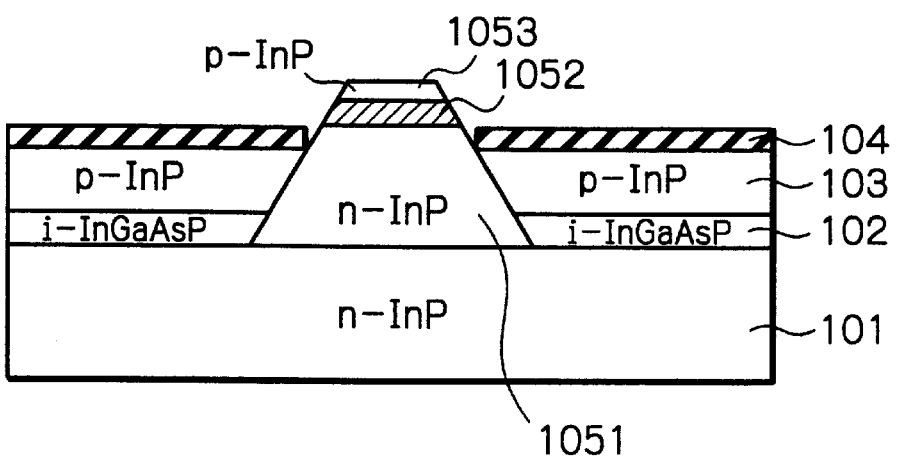

Next, referring to FIG. 1C, an n-type InP layer 1051, an MQW active layer 1052 consisting of six periods of one about 5 nm thick 1.0% compression-strained $In_{0.881}Ga_{0.119}As_{0.567}P_{0.433}$ well layer and one about 10 nm thick $In_{0.810}Ga_{0.190}As_{0.405}P_{0.595}$ barrier layer and a p-type InP layer 1053 are selectively and sequentially grown by an MOVPE process using the silicon dioxide pattern 104 as a mask. In this case, the MQW active layer 1052 has a photoluminescence wavelength of 1.29 μm. Then, the silicon dioxide pattern 104 is removed.

Figure 1D:
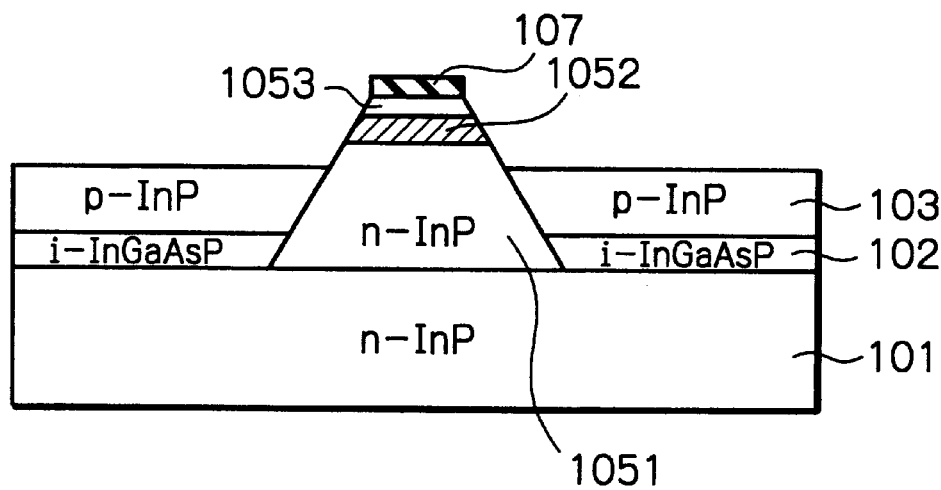

Next, referring to FIG. 1D, a silicon dioxide layer is deposited by a CVD process on the entire surface, and the silicon dioxide layer is patterned by a self-alignment process (see Y. Sakata et al., "All-Selective MOVPE-Grown 1.3 μm strained Multi-Quantum-Well Buried-Heterostructure Laser Diodes", IEEE Journal of Quantum Electronis, Vol. 35, No. 3, FIG. 3, p. 370, March 1999). As a result, a silicon dioxide pattern 107 is formed only on the p-type InP layer 1052, i.e., only on a mesa structure.

Figure 1E:
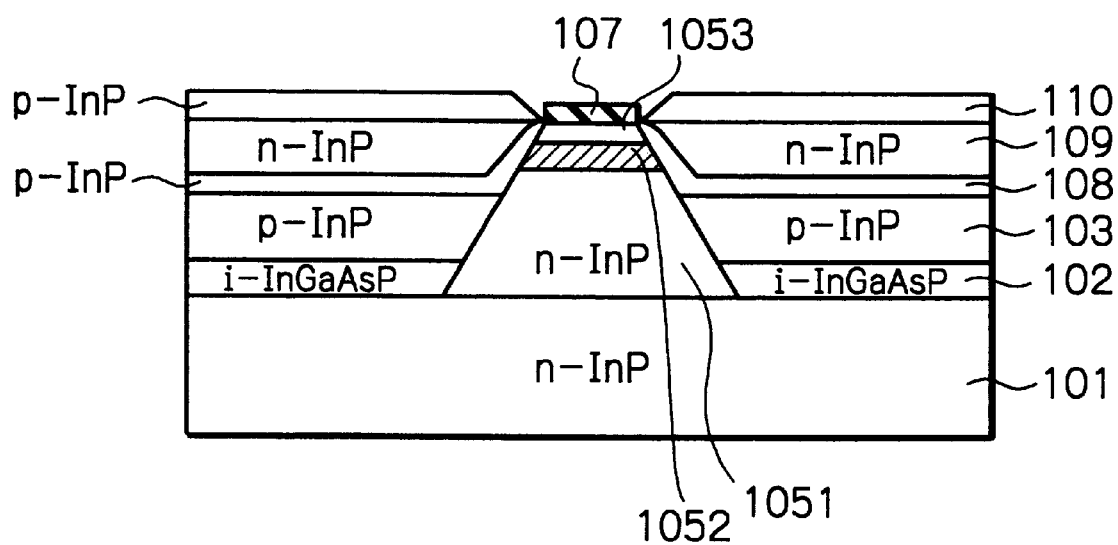

Next, referring to FIG. 1E, a p-type InP layer 108, an n-type InP layer 109 and a p-type InP layer 110 are sequentially grown by an MOVPE process using the silicon dioxide pattern 107 as a mask. Note that the p-type InP layer 108, the n-type InP layer 109 and the p-type InP layer 110 form a current blocking layer. Then, the silicon dioxide pattern 107 is removed.

Figure 1F:
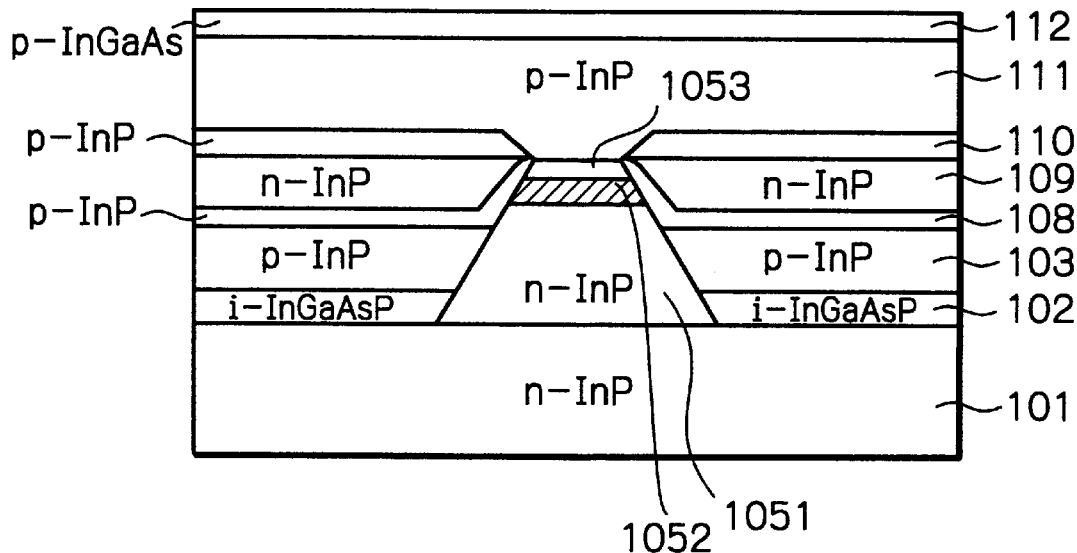

Next, referring to FIG. 1F, a p-type InP clad layer 111 and a p-type InGaAs cap layer 112 are sequentially grown by an MOVPE process.

Figure 1G:
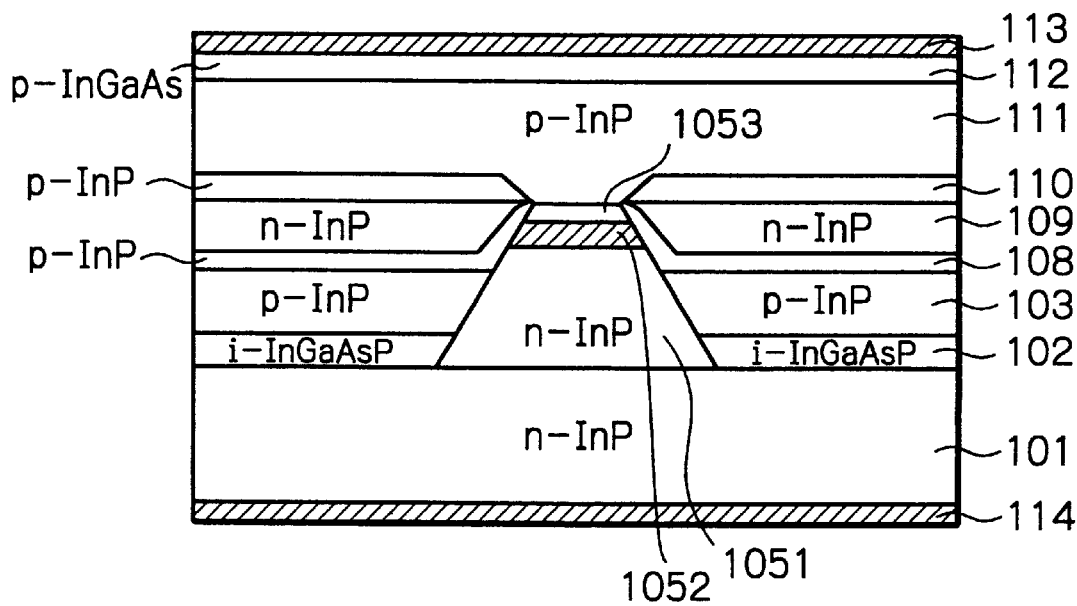
Figure 2:
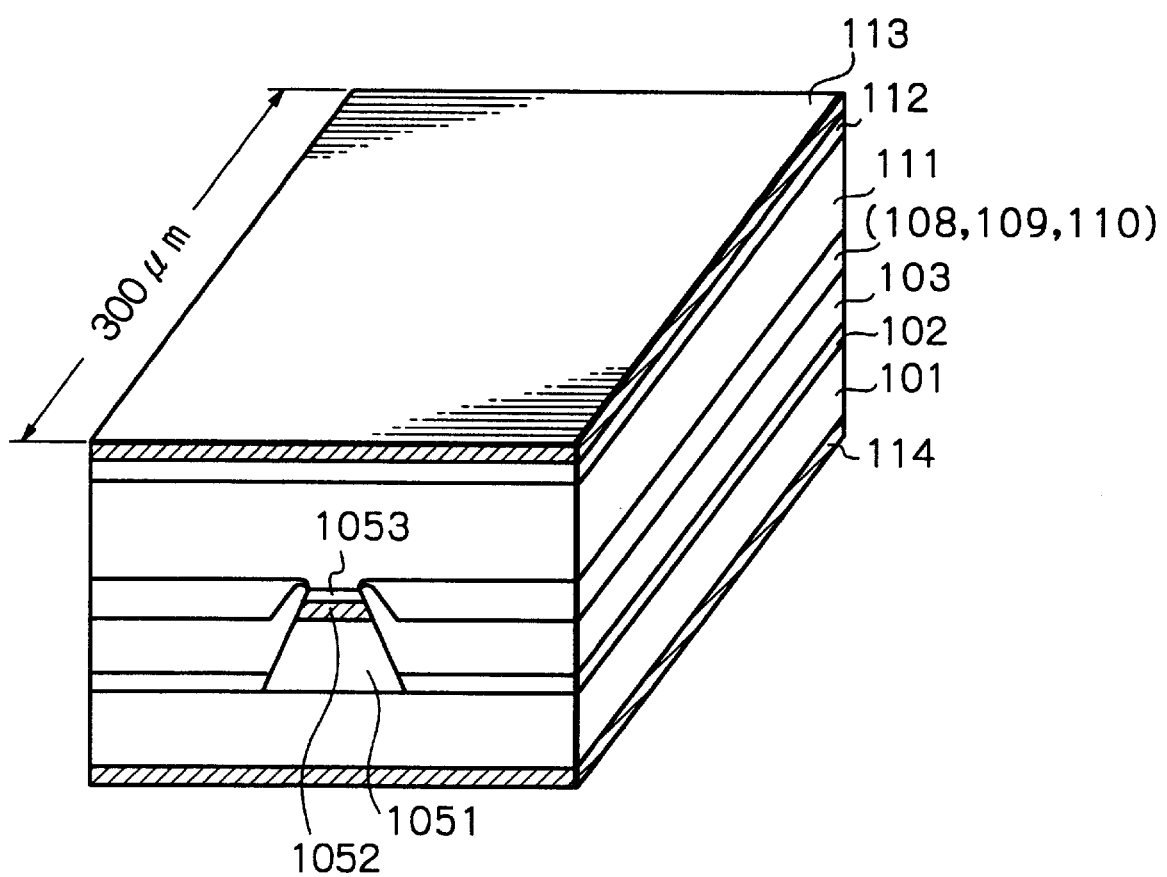
FIG. 2 is perspective view illustrating the semiconductor laser device obtained by the method as illustrated in FIG. 1A through 1G.

Finally, referring to FIG. 1G, a p-side electrode 113 and an n-side electrode 114 are formed on the front and back surfaces, respectively, thus completing a semiconductor laser device as illustrated in FIG. 2.

The semiconductor laser device of FIG. 2 is cut so that its length is 300 μm. Also, a 90 percent high reflection layer (not shown) is coated on a rear end facet, and an AlN heat sink (not shown) is adhered to the semiconductor laser device of FIG. 2. In this case, the following laser characteristics were obtained:

1) The threshold currents at 25° C. and 85° C. were 4 mA and 10 mA, respectively. The slope efficiencies at 25° C. and 85° C. were 0.60 W/A and 0.50 W/A, respectively.

Thus, at a high temperature such as 85° C., a low threshold current and a high slope efficiency were obtained.

2) A drive current in a 15 mW light output operation mode at 85° C. was 4 mA, which exhibited an excellent output characteristic.

FIG. 3A through 3H are cross-sectional views for explaining a second embodiment of the method for manufacturing a semiconductor laser device according to the present invention.

Figure 3A:
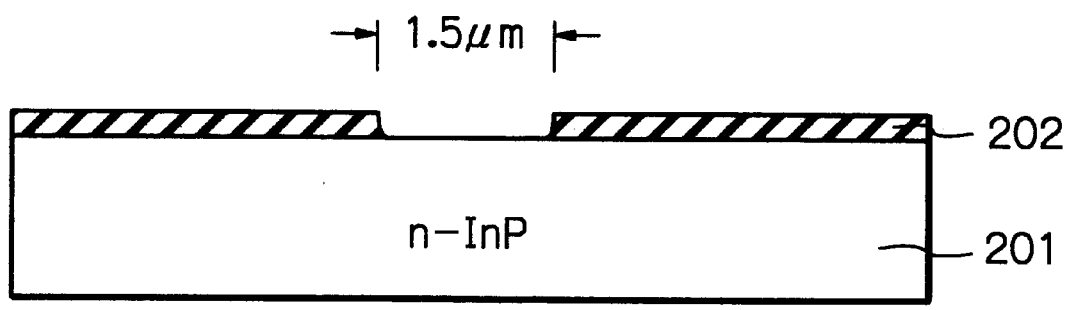
FIGS. 3A through 3H are cross-sectional views for explaining a second embodiment of the method for manufacturing a semiconductor laser device according to the present invention.

First, referring to FIG. 3A, a silicondioxide layer is deposited by a CVD process on a (100) n-type InP substrate 201, and the silicon dioxide layer is patterned by a photolithography and etching process. As a result, a silicon dioxide pattern 202 having an about 1.5 μm wide-striped space along the direction [011] of the n-type InP substrate 201.

Figure 3B:
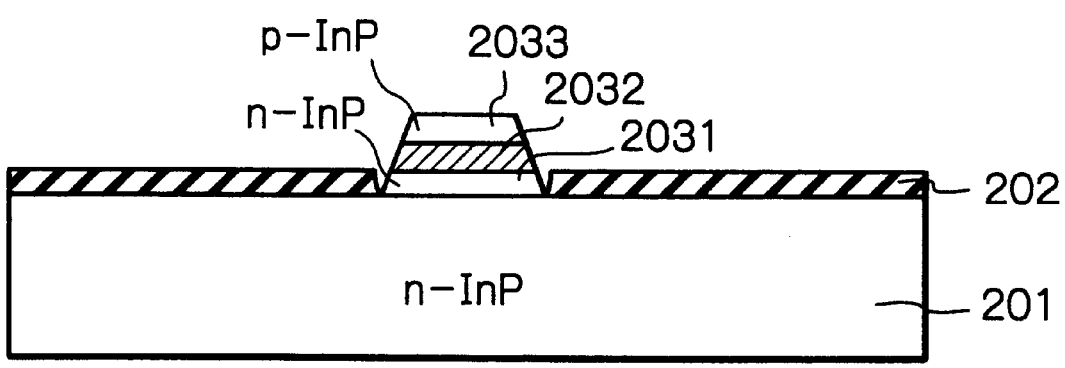

Next, referring to FIG. 3B, an n-type InP layer 2031, an MQW active layer 2032 consisting of six periods of one about 5 nm thick 1.0% compression-strained $In_{0.881}Ga_{0.119}As_{0.567}P_{0.433}$ well layer and one about 10 nm thick $In_{0.810}Ga_{0.190}As_{0.405}P_{0.595}$ barrier layer and a p-type InP layer 2033 are selectively and sequentially is grown by an MOVPE process using the silicon dioxide pattern 202 as a mask. In this case, the MQW active layer 2032 has a photoluminescence wavelength of 1.29 μm. Then, the silicon dioxide pattern 202 is removed.

Figure 3C:
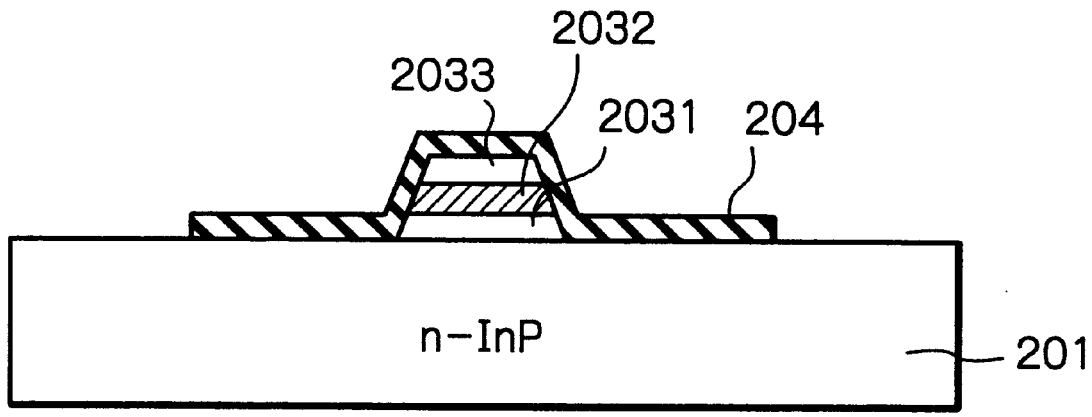

Next, referring to FIG. 3C, a silicon dioxide layer is deposited by a CVD process on the entire surface, and the silicon dioxide layer is patterned by a photolithography and etching process. As a result, a silicon dioxide pattern 204 is formed on the p-type InP layer 2033 and its periphery, i.e., on a mesa structure and its periphery.

Figure 3D:
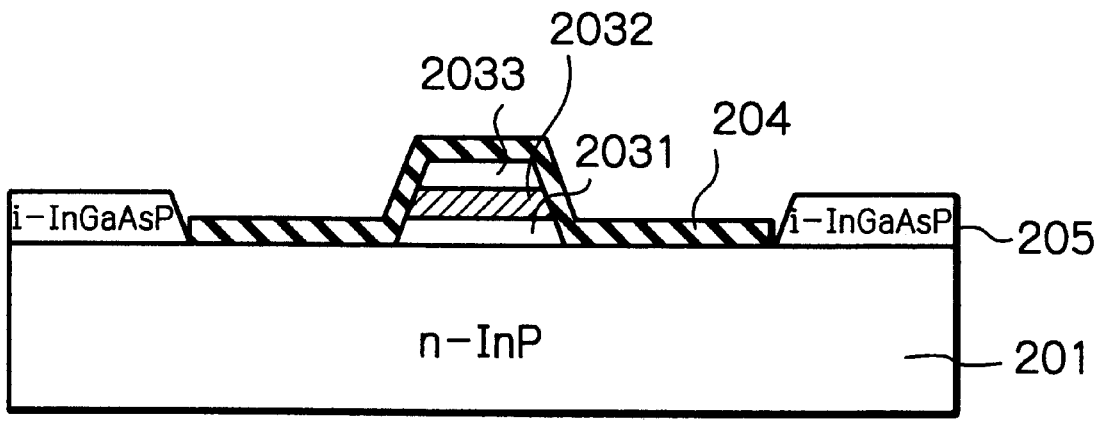

Next, referring to FIG. 3D, an about 0.10 μm thick i-type InGaAsP carrier recombination layer 205 having a bandgap wavelength of about 1.20 μm is grown by an MOVPE process on the n-type InP substrate 101 using the silicon dioxide pattern 204 as a mask. Then, the silicon dioxide pattern 204 is removed.

Figure 3E:
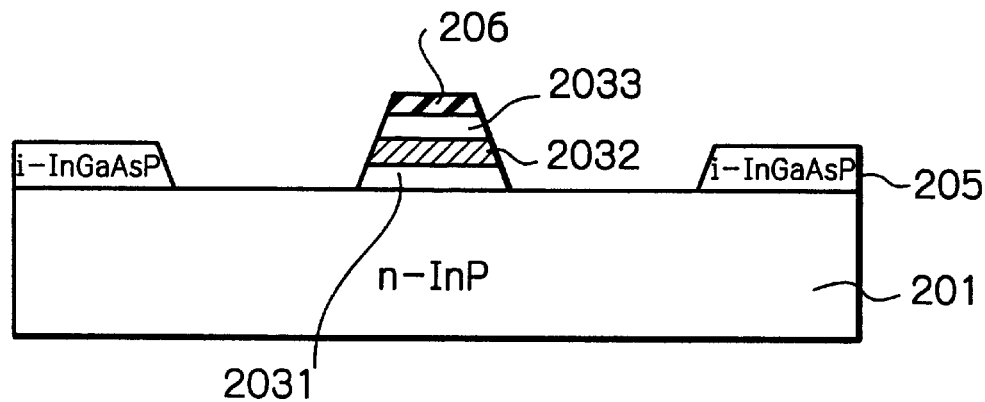

Next, referring to FIG. 3E, a silicon dioxide layer is deposited by a CVD process on the entire surface, and the silicon dioxide layer is patterned by a self-alignment process. As a result, a silicon dioxide pattern 206 is formed only on the p-type InP layer 2033, i.e., only on a mesa structure.

Figure 3F:
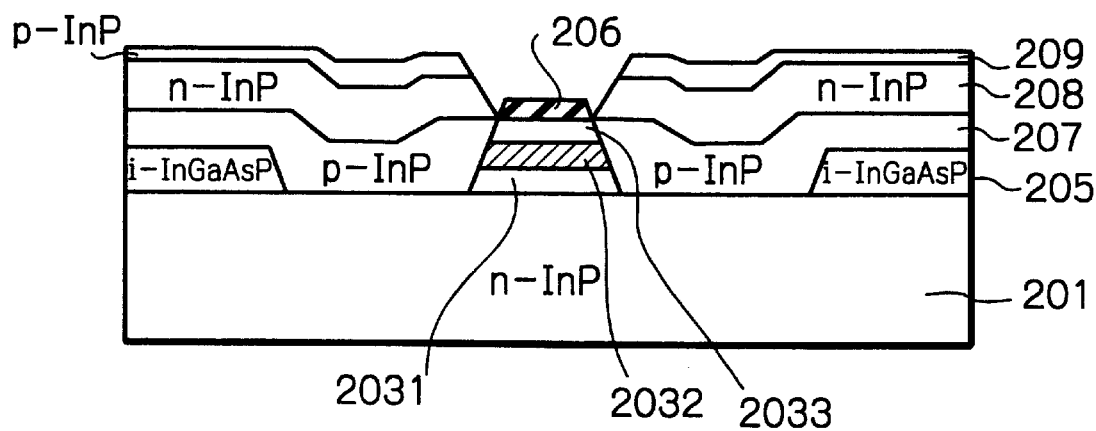

Next, referring to FIG. 3F, a p-type InP layer 207, an n-type InP layer 208 and a p-type InP layer 209 are sequentially grown by an MOVPE process using the silicon dioxide pattern 206 as a mask. Note that the p-type InP layer 207, the n-type InP layer 208 and the p-type InP layer 209 form a current blocking layer. Then, the silicon dioxide pattern 206 is removed.

Figure 3G:
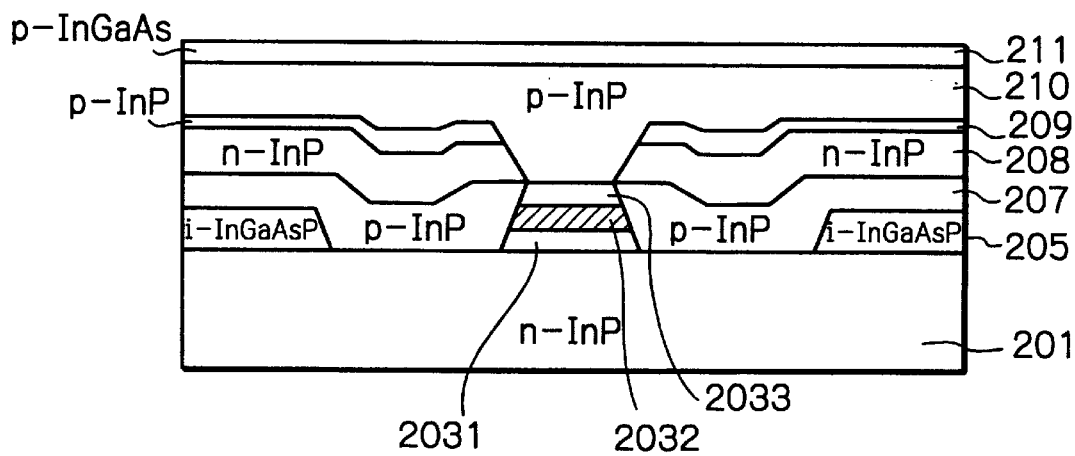

Next, referring to FIG. 3G, a p-type InP clad layer 210 and a p-type InGaAs cap layer 211 are sequentially grown by an MOVPE process.

Figure 3H:
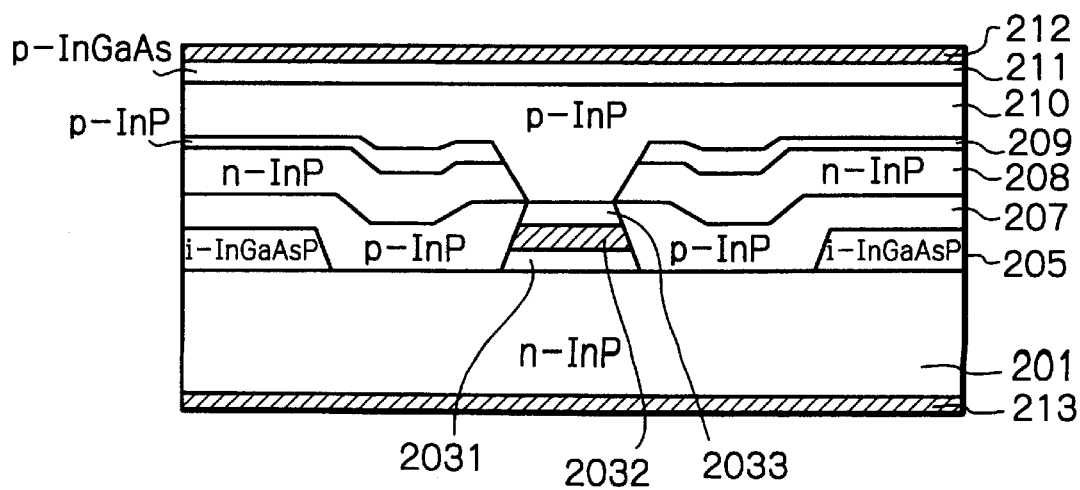
Figure 4:
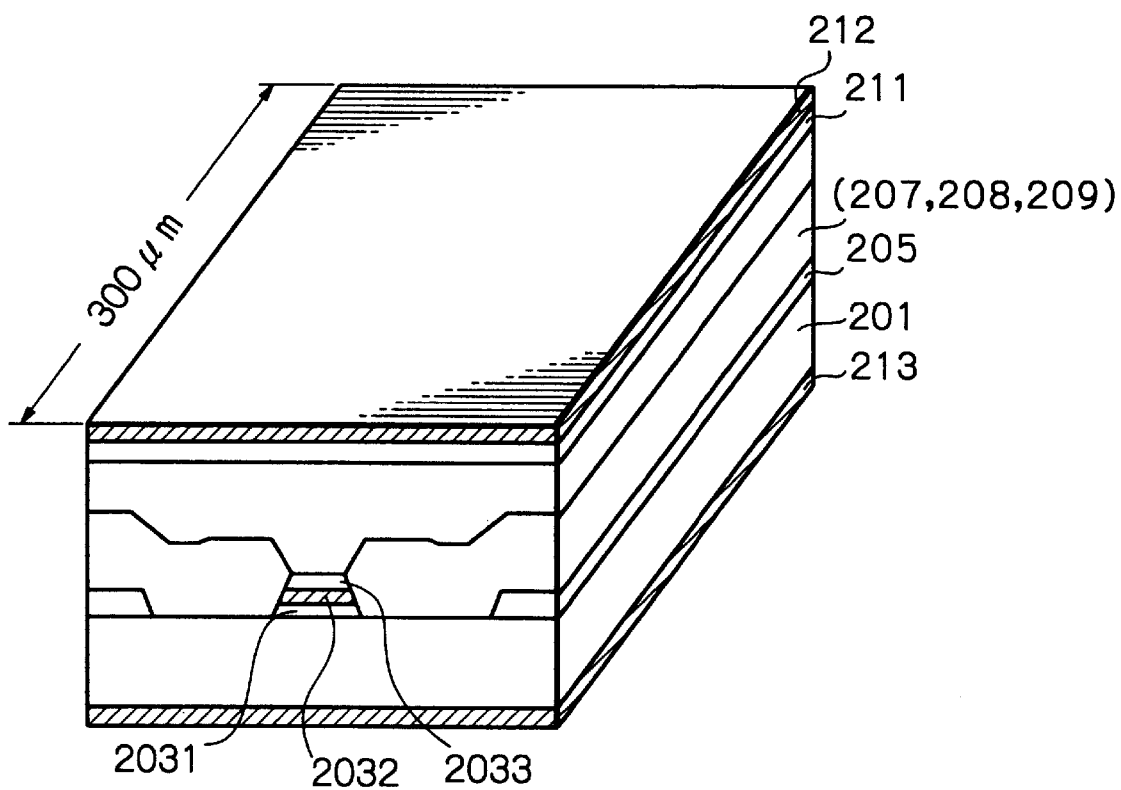
FIG. 4 is a perspective view illustrating the semiconductor laser device obtained by the method as illustrated in FIG. 3A through 3H.

Finally, referring to FIG. 3H, a p-side electrode 212 and an n-side electrode 213 are formed on the front and back surfaces, respectively, thus completing a semiconductor laser device as illustrated in FIG. 4.

The semiconductor laser device of FIG. 4 is cut so that its length is 300 μm. Also, a 90 percent high reflection layer (not shown) is coated on a rear end facet, and an AlN heat sink (not shown) is adhered to the semiconductor laser device of FIG. 4. In this case, the following laser characteristics were obtained:

1) The threshold currents at 25° C. and 85° C. were 3.9 mA and 9.8 mA, respectively. The slope efficiencies at 25° C. and 85° C. were 0.61 W/A and 0.51 W/A, respectively.

Thus, at a high temperature such as 85° C., a low threshold current and a high slope efficiency were obtained.

2) A drive current in a 15 mW light output operation mode at 85° C. was 40 mA, which exhibited an excellent output characteristic.

FIG. 5A through 5F are cross-sectional views for explaining a third embodiment of the method for manufacturing a semiconductor laser device according to the present invention.

Figure 5A:
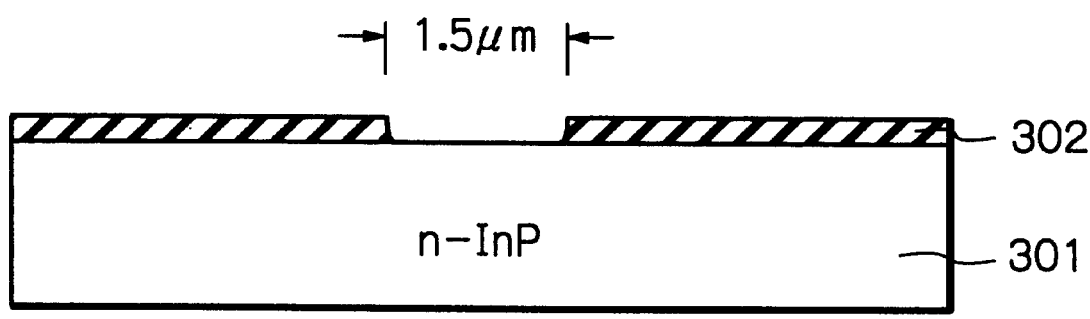
FIGS. 5A through 5F are cross-sectional views for explaining a third embodiment of the method for manufacturing a semiconductor laser device according to the present invention.

First, referring to FIG. 5A, in the same way as in FIG. 3A, silicon dioxide layer is deposited by a CVD process on a (100) n-type InP substrate 301, and the silicon dioxide layer is patterned by a photolithography and etching process. As a result, a silicon dioxide pattern 302 having an about 1.5 μm wide-striped space is formed along the direction [011] of the n-type InP substrate 301.

Figure 5B:
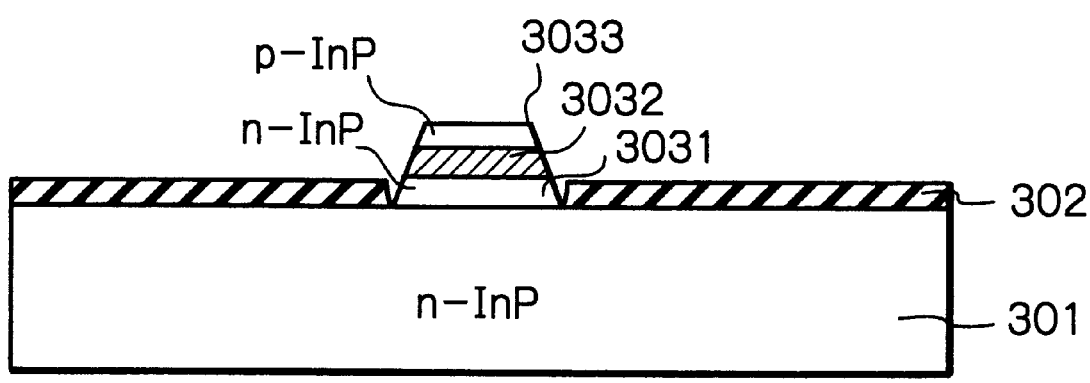

Next, referring to FIG. 5B, in the same way as in FIG. 3B, an n-type InP layer 3031, an MQW active layer 3032 consisting of six periods of one about 5 nm thick 1.0% compression-strained $In_{0.881}Ga_{0.119}As_{0.567}P_{0.433}$ well layer and one about 10 nm thick $In_{0.810}Ga_{0.190}As_{0.405}P_{0.595}$ barrier layer and a p-type InP layer 3033 are selectively and sequentially grown by an MOVPE process using the silicon dioxide pattern 302 as a mask. In this case, the MQW active layer 303 has a photoluminescence wavelength of 1.29 μm. Then, the silicon dioxide pattern 302 is removed.

Figure 5C:
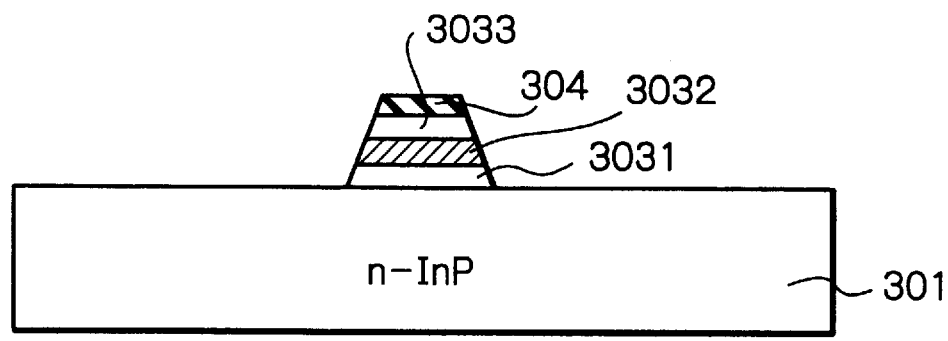

Next, referring to FIG. 5C, a silicon dioxide layer is deposited by a CVD process on the entire surface, and the silicondioxide layer is patterned by a self-alignment process. As a result, a silicon dioxide pattern 304 is formed only on the p-type InP layer 3033, i.e., only on a mesa structure.

Figure 5D:
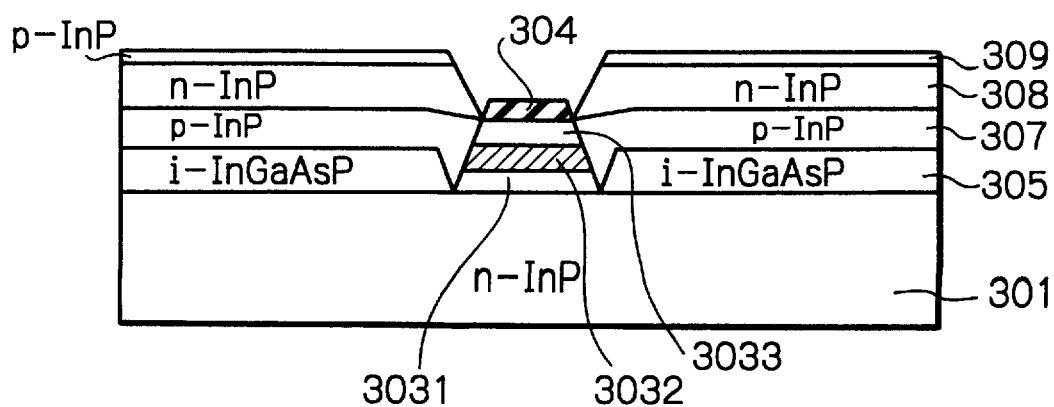

Next, referring to FIG. 5D, an about 0.10 μm thick i-type InGaAsP carrier recombination layer 305 having a bandgap wavelength of about 1.20 μm, a p-type InP layer 307, an n-type InP layer 308 and a p-type InP layer 309 are sequentially grown by an MOVPE process using the silicon dioxide pattern 304 as a mask. Note that p-type InP layer 307, the n-type InP layer 308 and the p-type InP layer 309 form a current blocking layer. Then, the silicon dioxide pattern 304 is removed.

Figure 5E:
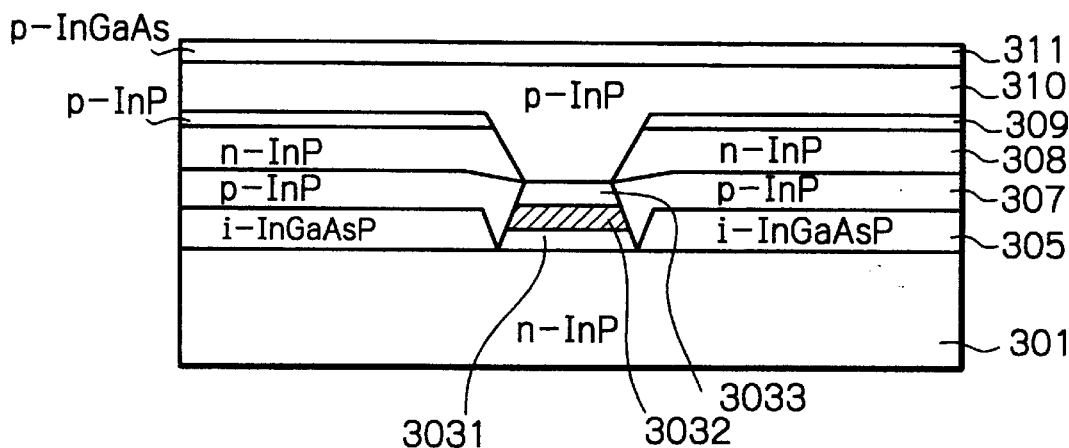

Next, referring to FIG. 5E, in the same way as in FIG. 3G, a p-type InP clad layer 310 and a p-type InGaAs cap layer 311 are sequentially grown by an MOVPE process.

Figure 5F:
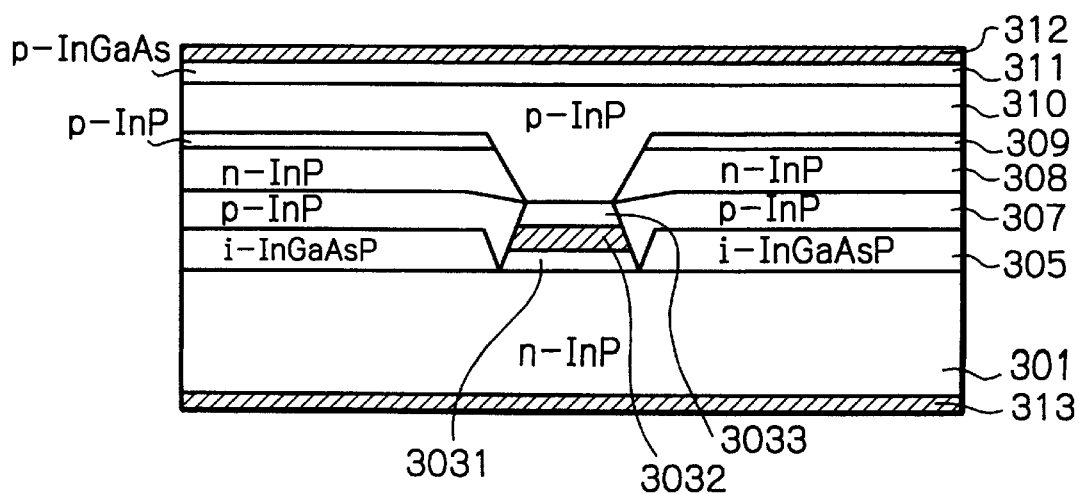
Figure 6:
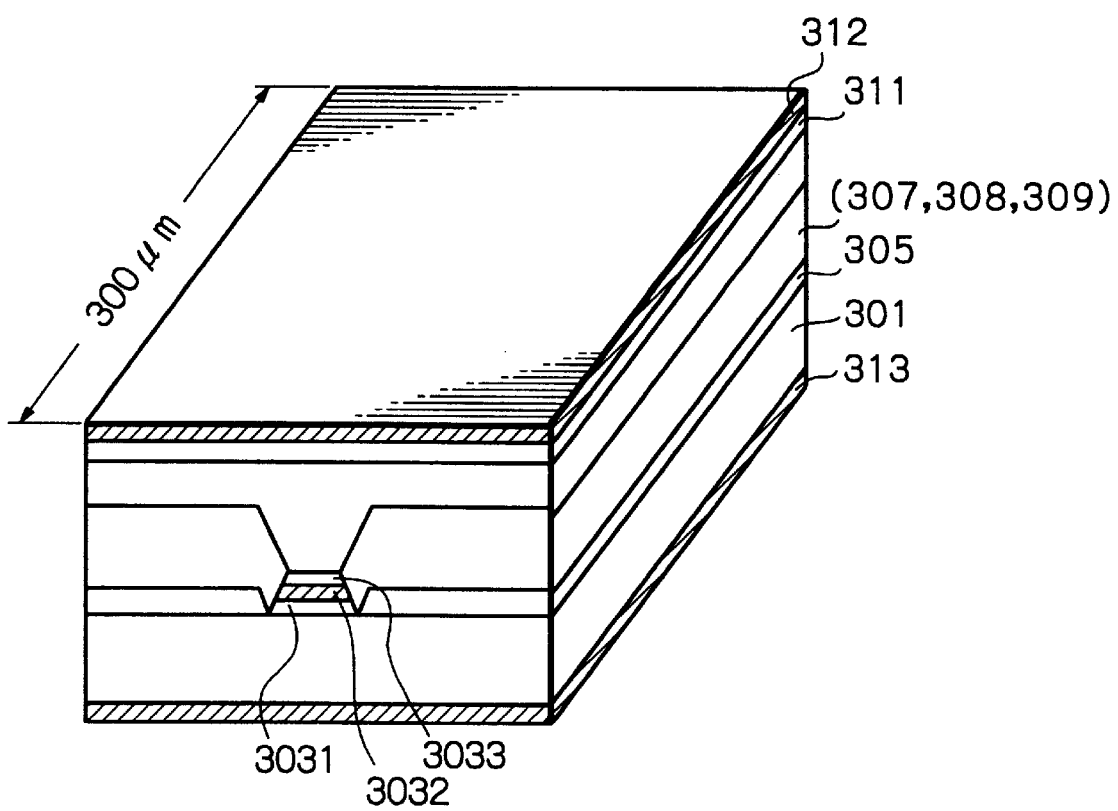
FIG. 6 is a perspective view illustrating the semiconductor laser device obtained by the method as illustrated in FIG. 5A through 5F.

Finally, referring to FIG. 5F, in the same way as in FIG. 3H, a p-side electrode 312 and an n-side electrode 313 are formed on the front and back surfaces, respectively, thus completing a semiconductor laser device as illustrated in FIG. 6.

The semiconductor laser device of FIG. 6 is cut so that its length is 300 μm. Also, a 90 percent high reflection layer (not shown) is coated on a rear end facet, and an AlN heat sink (not shown) is adhered to the semiconductor laser device of FIG. 6. In this case, the following laser characteristics were obtained:

1) The threshold currents at 25° C. and 85° C. were 4 mA and 10 mA, respectively. The slope efficiencies at 25° C. and 85° C. were 0.58 W/A and 0.49 W/A, respectively.

Thus, at a high temperature such as 85° C., a low threshold current and a high slope efficiency were obtained.

2) A drive current in a 15 mW light output operation mode at 85° C. was 42 mA, which exhibited an excellent output characteristic.

FIG. 7A through 7H are cross-sectional views for explaining a fourth embodiment of the method for manufacturing a semiconductor laser device according to the present invention.

Figure 7A:
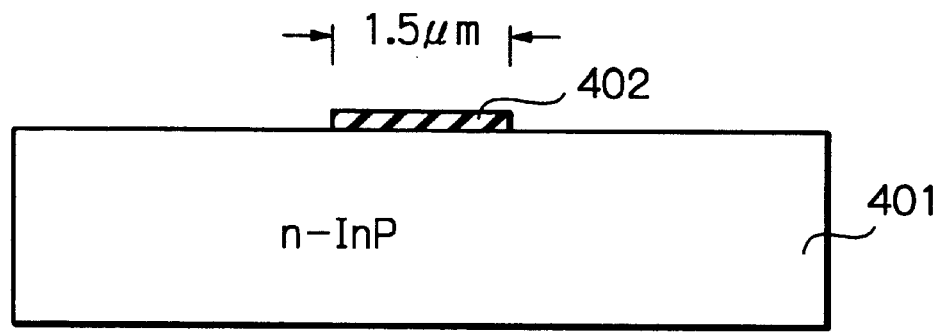
FIGS. 7A through 7H are cross-sectional views for explaining a fourth embodiment of the method for manufacturing a semiconductor laser device according to the present invention.

First, referring to FIG. 7A, a silicon dioxide layer is deposited by a CVD process on a (100) n-type InP substrate 401, and the silicon dioxide layer is patterned by a photolithography and etching process. As a result, an about 1 μm wide silicon dioxide pattern 402 is formed along the direction [011] of the n-type InP substrate 401.

Figure 7B:
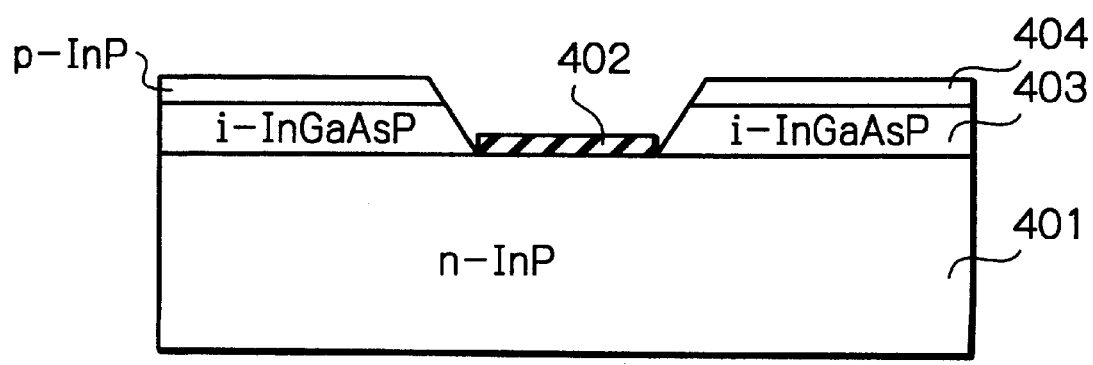

Next, referring to FIG. 7B, an about 0.1 μm thick i-type InGaAsP carrier recombination layer 403 having a bandgap wavelength of about 1.20 μm and a p-type InP layer 404 are sequentially grown by an MOVPE process on the n-type InP substrate 101 using the silicon dioxide pattern 402 as a mask. Then, the silicon dioxide pattern 402 is removed.

Figure 7C:
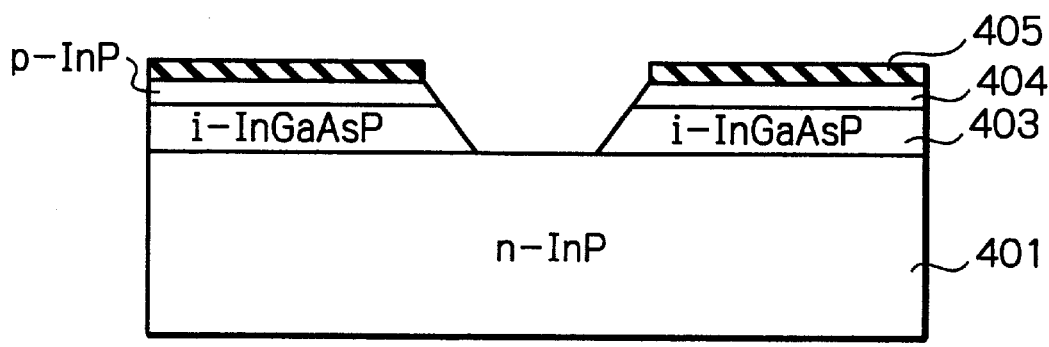

Next, referring to FIG. 7C, a silicon dioxide layer is deposited by a CVD process on the entire surface, and the silicon dioxide layer is patterned by a photolithography and etching process. As a result, a silicon dioxide pattern 405 is formed on the p-type InP layer 404.

Figure 7D:
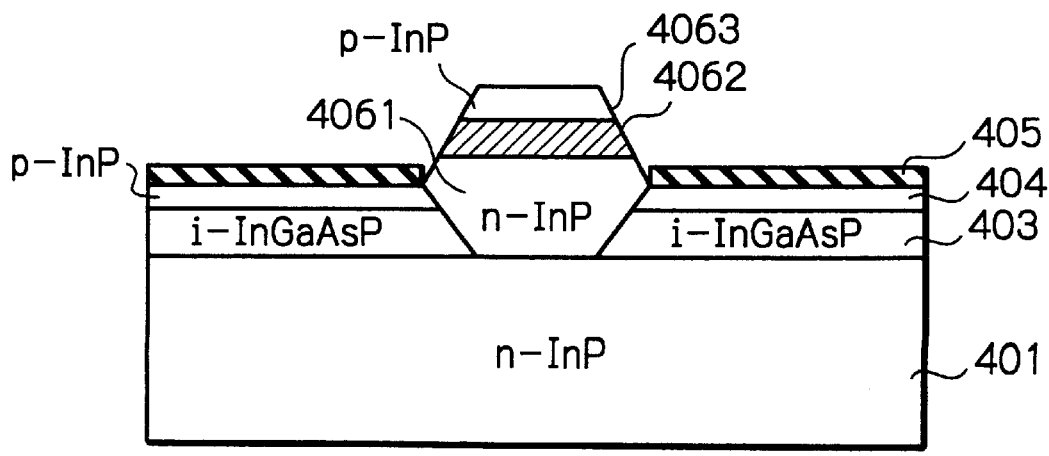

Next, referring to FIG. 7D, an n-type InP layer 4061, an MQW active layer 4062 consisting of six periods of one about 5 nm thick 1.0% compression-strained $In_{0.881}Ga_{0.119}As_{0.567}P_{0.433}$ well layer and one about 10 nm thick $In_{0.810}Ga_{0.190}As_{0.405}P_{0.595}$ barrier layer and a p-type InP layer 4063 are selectively and sequentially grown by an MOVPE process using the silicon dioxide pattern 405 as a mask. In this case, the MQW active layer 407 has a photoluminescence wavelength of 1.29 μm. Then, the silicon dioxide pattern 405 is removed.

Figure 7E:
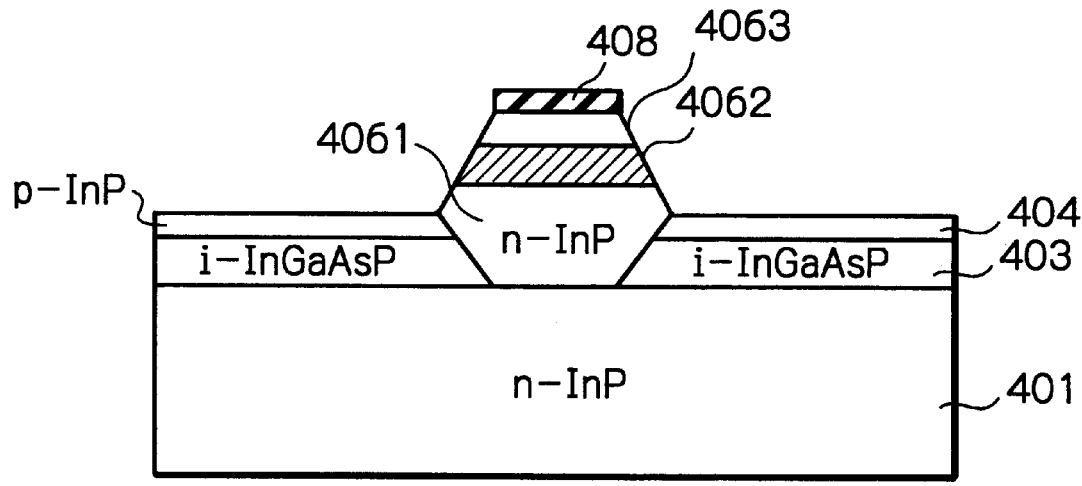

Next, referring to FIG. 7E, a silicon dioxide layer is deposited by a CVD process on the entire surface, and the silicon dioxide layer is patterned by a self-alignment process. As a result, a silicon dioxide pattern 408 is formed only on the p-type InP layer 4063, i.e., only on a mesa structure.

Figure 7F:
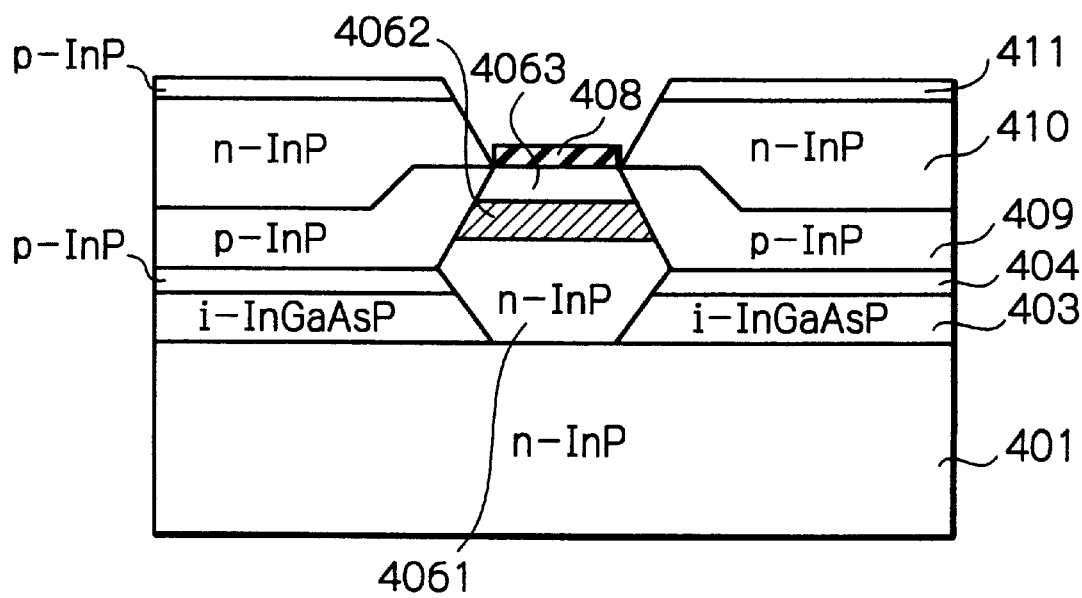

Next, referring to FIG. 7F, in the same way as in FIG. 3F, a p-type InP layer 409, an n-type InP layer 410 and a p-type InP layer 411 are sequentially grown by an MOVPE process using the silicon dioxide pattern 408 as a mask. Note that p-type InP layer 409, the n-type InP layer 410 and the p-type InP layer 411 form a current blocking layer. Then, the silicon dioxide pattern 408 is removed.

Figure 7G:
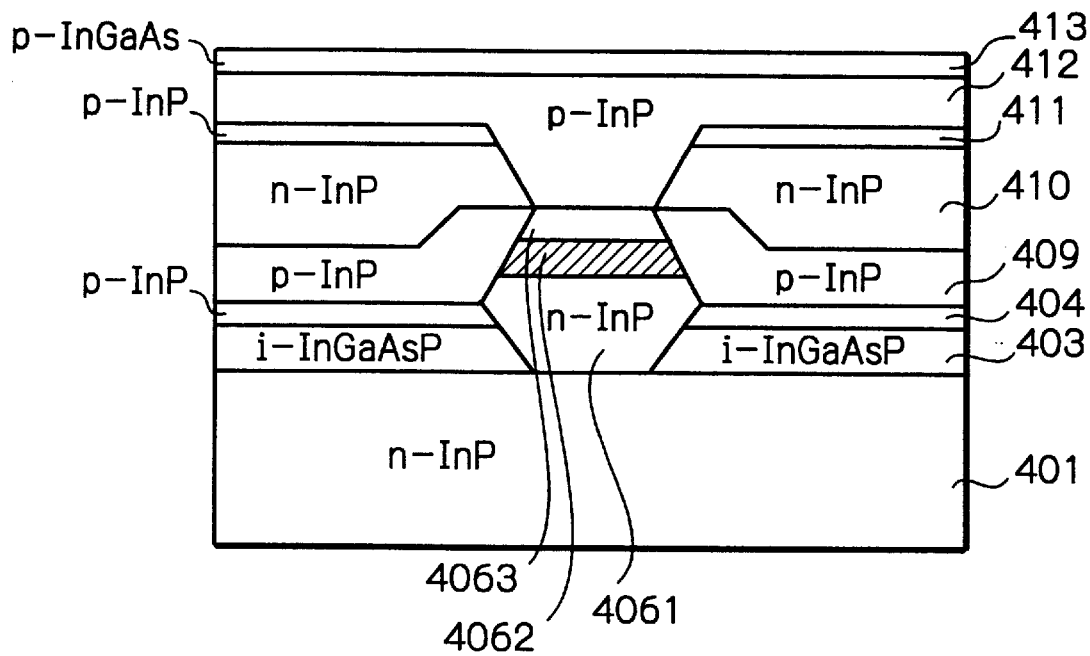

Next, referring to FIG. 7G, in the same way as in FIG. 3G, a p-type InP clad layer 412 and a p-type InGaAs cap layer 413 are sequentially grown by an MOVPE process.

Figure 7H:
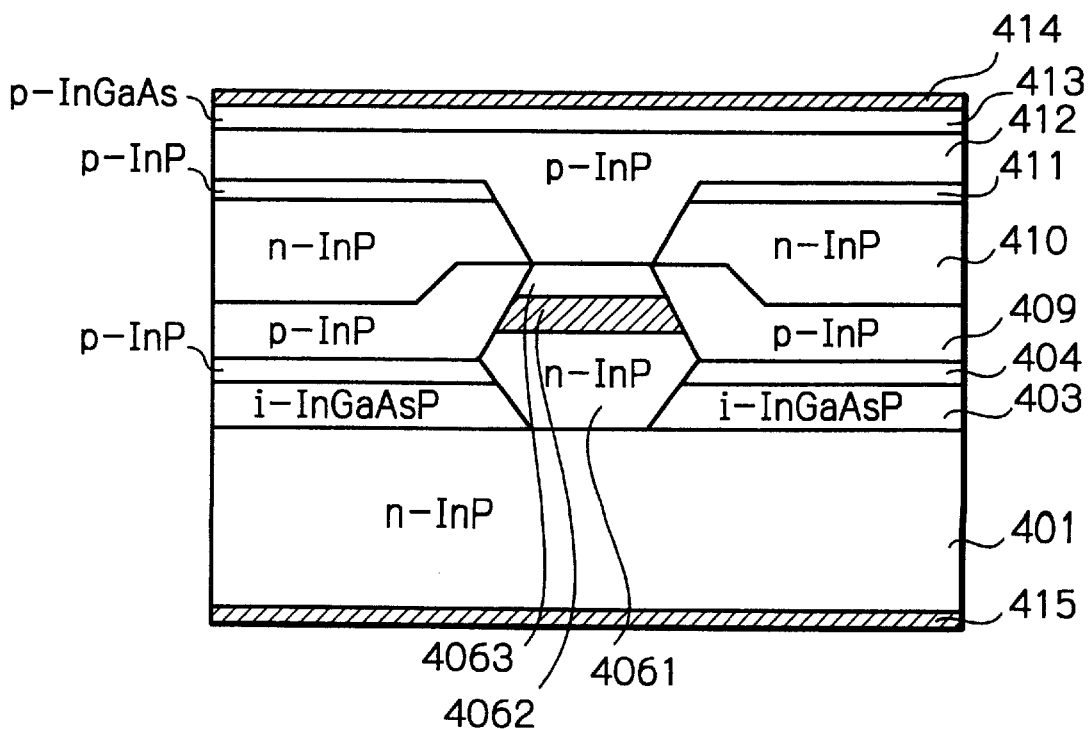

Finally, referring to FIG. 7H, in the same way as in FIG. 3H, a p-side electrode 414 and an n-side electrode 415 are formed on the front and back surfaces, respectively, thus completing a semiconductor laser device as illustrated in FIG. 7.

Figure 8:
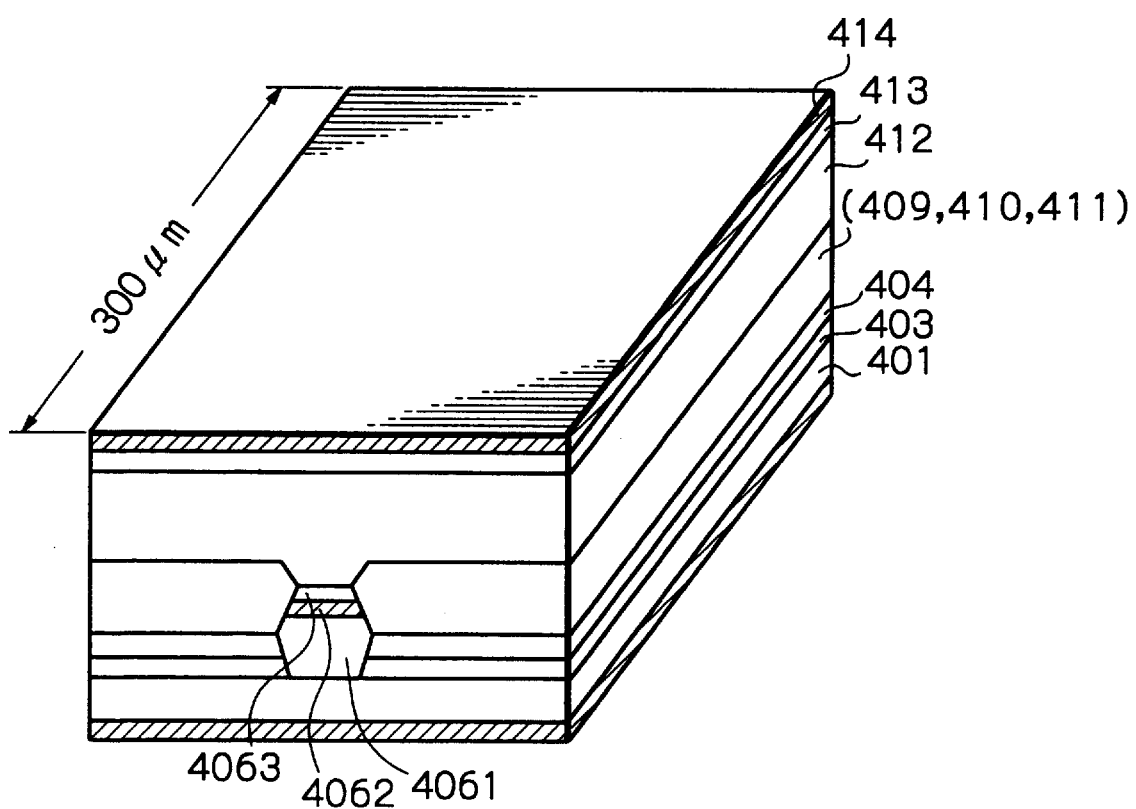
FIG. 8 is a perspective view illustrating the semiconductor laser device obtained by the method as illustrated in FIG. 7A through 7H.

The semiconductor laser device of FIG. 8 is cut so that its length is 300 μm. Also, a 90 percent high reflection layer (not shown) is coated on a rear end facet, and an AlN heat sink (not shown) is adhered to the semiconductor laser device of FIG. 8. In this case, the following laser characteristics were obtained:

1) The threshold currents at 25° C. and 85° C. were 4 mA and 10 mA, respectively. The slope efficiencies at 25° C. and 85° C. were 0.60 W/A and 0.50 W/A, respectively.

Thus, at a high temperature such as 85° C., a low threshold current and a high slope efficiency were obtained.

2) A drive current in a 15 mW light output operation mode at 85° C. was 41 mA, which exhibited an excellent output characteristic.

FIG. 9A through 9H are cross-sectional views for explaining a fifth embodiment of the method for manufacturing a semiconductor laser device according to the present invention.

Figure 9A:
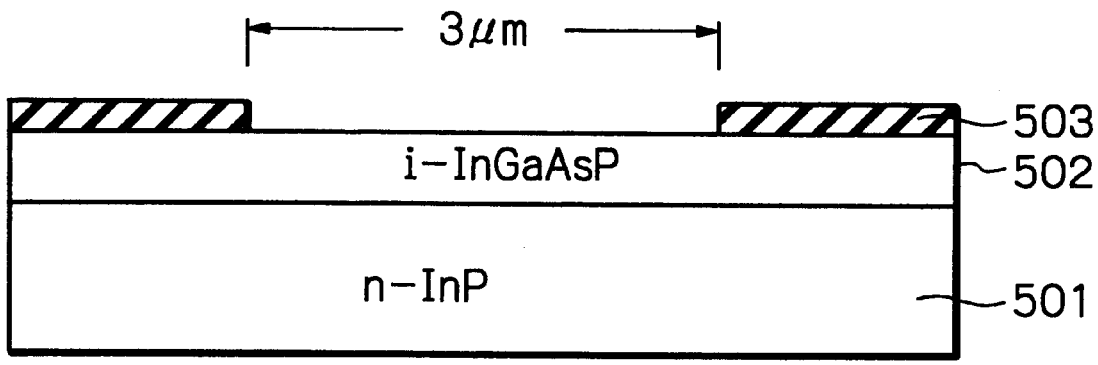
FIGS. 9A through 9H are cross-sectional views for explaining a fifth embodiment of the method for manufacturing a semiconductor laser device according to the present invention.

First, referring to FIG. 9A, an about 0.10 μm thick i-type InGaAsP carrier recombination layer 502 having a bandgap wavelength of about 1.20 μm is grown by an MOVPE process on a (100) n-type InP substrate 501. Then, a silicon dioxide layer is deposited by a CVD process on the entire surface, and the silicon dioxide layer is patterned by a photolithography and etching process. As a result, a silicon dioxide pattern 503 having an about 3 μm wide-striped space is formed along the direction [011] of the n-type InP substrate 501.

Figure 9B:
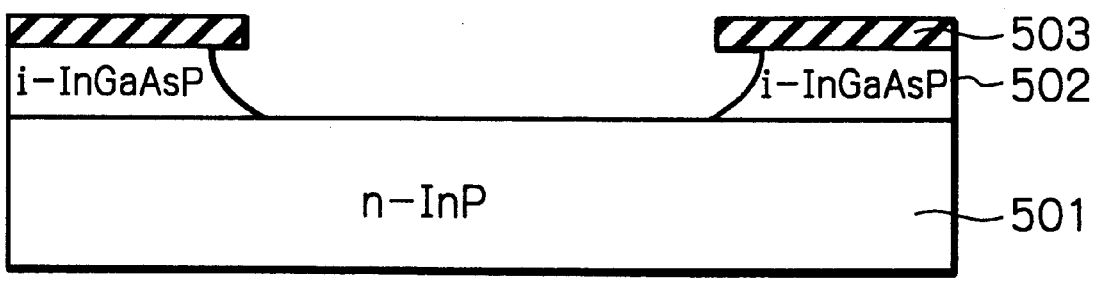

Next, referring to FIG. 9B, the i-type InGaAsP carrier recombination layer 502 is etched by a wet etching process using the silicon dioxide pattern 503 as a mask. Then, the silicon dioxide pattern 503 is removed.

Figure 9C:
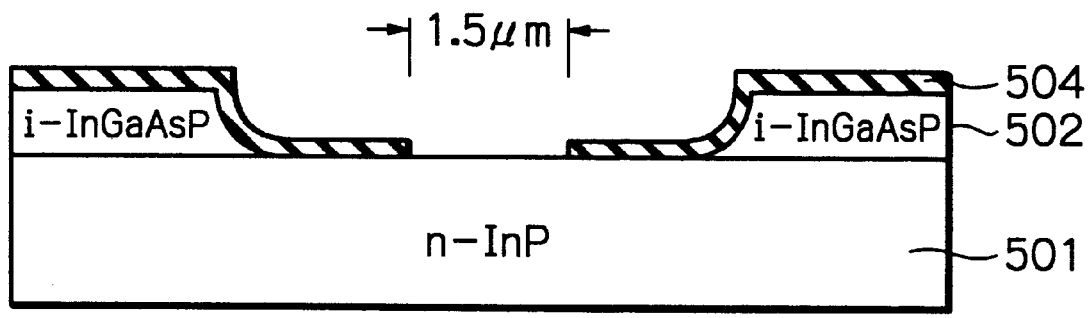

Next, referring to FIG. 9C, a silicon dioxide layer is deposited by a CVD process on the entire surface, and the silicon dioxide layer is patterned by a photolithography and etching process. As a result, a silicon dioxide pattern 504 having an about 1.5 μm wide-striped space is formed along the direction [011] of the n-type InP substrate 501.

Figure 9D:
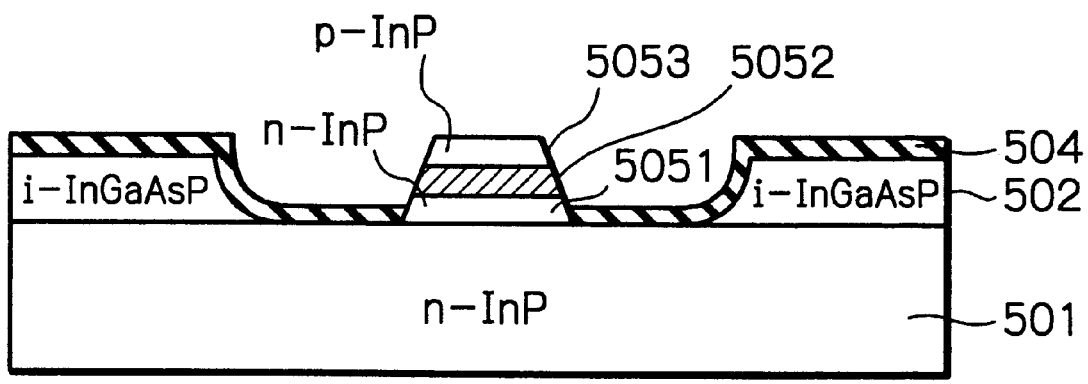

Next, referring to FIG. 9D, an n-type InP layer 5051, an MQW active layer 5052 consisting of six periods of one about 5 nm thick 1.0% compression-strained $In_{0.881}Ga_{0.119}As_{0.567}P_{0.433}$ well layer and one about 10 nm thick $In_{0.810}Ga_{0.190}As_{0.405}P_{0.595}$ barrier layer and a p-type InP layer 5053 are selectively and sequentially grown by an MOVPE process using the silicon dioxide pattern 504 as a mask. In this case, the MQW active layer 505 has a photoluminescence wavelength of 1.29 μm. Then, the silicon dioxide pattern 504 is removed.

Figure 9E:
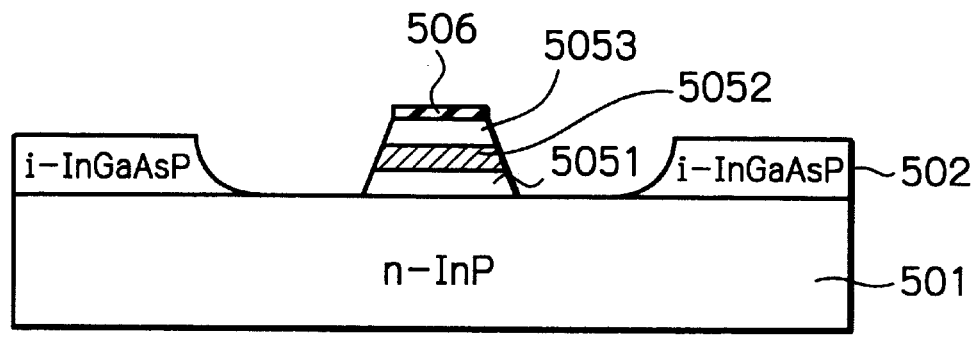

Next, referring to FIG. 9E, in the same way as in FIG. 1C, a silicon dioxide layer is deposited by a CVD process on the entire surface, and the silicon dioxide layer is patterned by a self-alignment process. As a result, a silicon dioxide pattern 506 is formed only on the p-type InP layer 5053, i.e., only on a mesa structure.

Figure 9F:
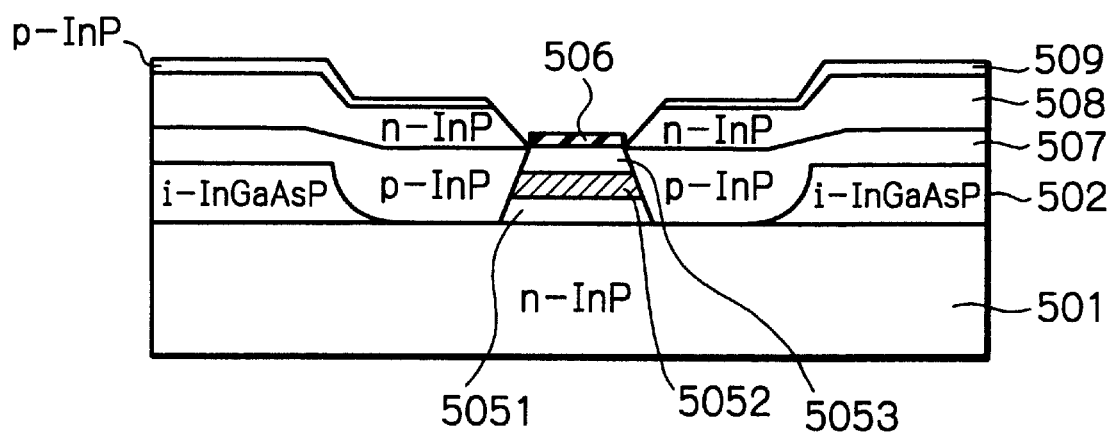

Next, referring to FIG. 9F, in the same way as in FIG. 1E, a p-type InP layer 507, an n-type InP layer 508 and a p-type InP layer 509 are sequentially grown by an MOVPE process using the silicon dioxide pattern 506 as a mask. Note that p-type InP layer 507, the n-type InP layer 508 and the p-type InP layer 509 form a current blocking layer. Then, the silicon dioxide pattern 506 is removed.

Figure 9G:
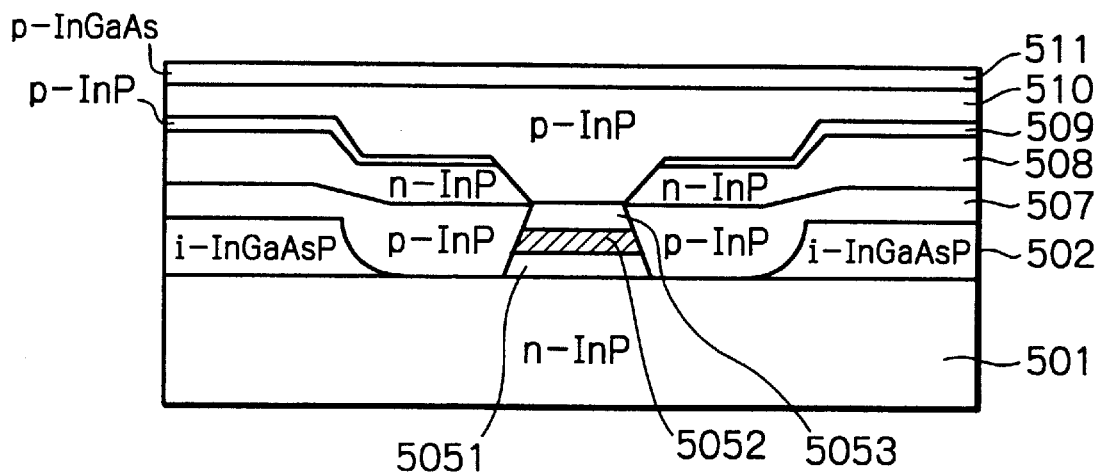

Next, referring to FIG. 9G, in the same way as in FIG. 1F, a p-type InP clad layer 510 and a p-type InGaAs cap layer 511 are sequentially grown by an MOVPE process.

Figure 9H:
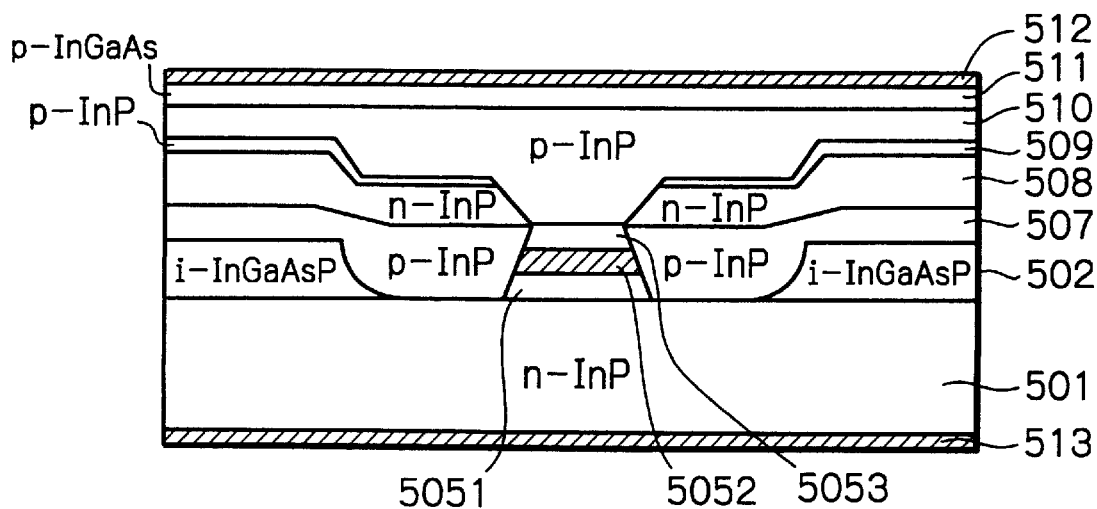
Figure 10:
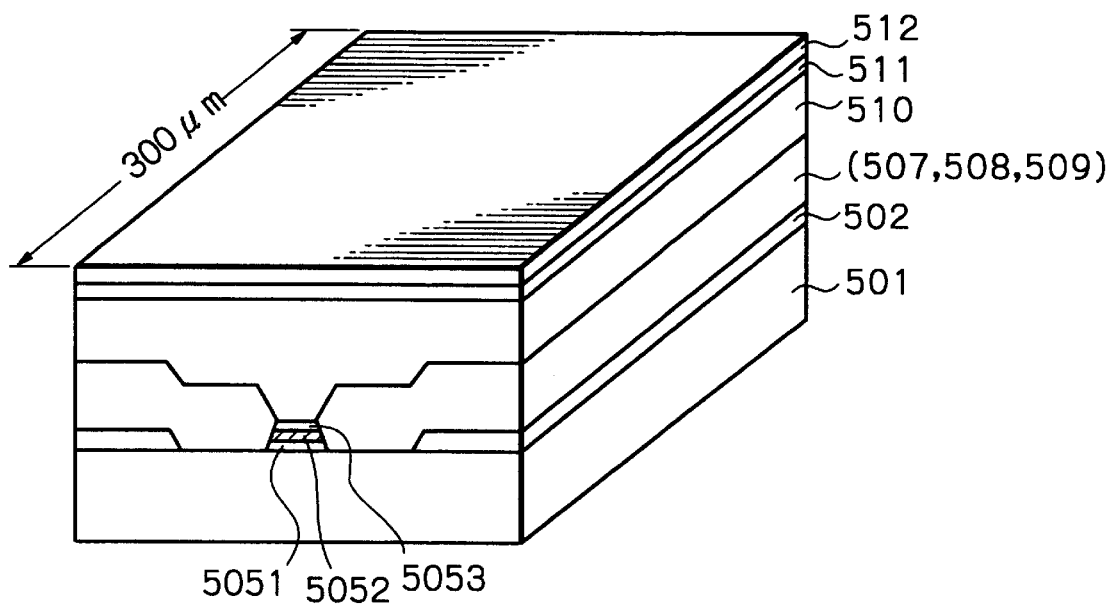
FIG. 10 is a perspective view illustrating the semiconductor laser device obtained by the method as illustrated in FIG. 9A through 9H.

Finally, referring to FIG. 9H, in the same way as in FIG. 1G, a p-side electrode 512 and an n-side electrode 513 are formed on the front and back surfaces, respectively, thus completing a semiconductor laser device as illustrated in FIG. 10.

The semiconductor laser device of FIG. 10 is cut so that its length is 300 μm. Also, a 90 percent high reflection layer (not shown) is coated on a rear end facet, and an AlN heat sink (not shown) is adhered to the semiconductor laser device of FIG. 10. In this case, the following laser characteristics were obtained:

1) The threshold currents at 25° C. and 85° C. were 4 mA and 10 mA, respectively. The slope efficiencies at 25° C. and 85° C. were 0.60 W/A and 0.50 W/A, respectively.

Thus, at a high temperature such as 85° C., a low threshold current and a high slope efficiency were obtained.

2) A drive current in a 15 mW light output operation mode at 85° C. was 41 mA, which exhibited an excellent output characteristic.

FIG. 11A through 11G are cross-sectional views for explaining a sixth embodiment of the method for manufacturing a semiconductor laser device according to the present invention.

Figure 11A:
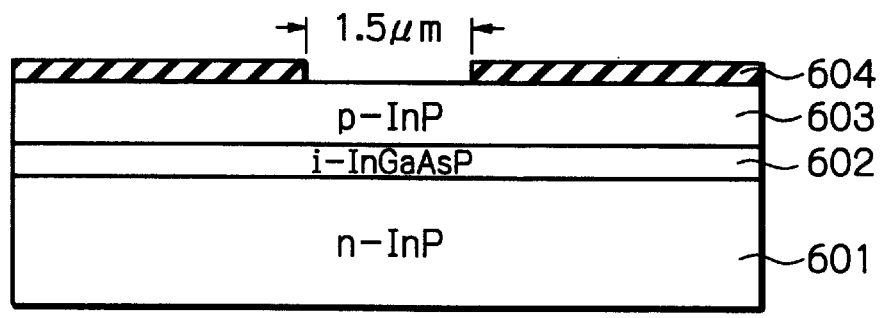
FIGS. 11A through 11G are cross-sectional views for explaining a sixth embodiment of the method for manufacturing a semiconductor laser device according to the present invention.

First, referring to FIG. 11A, in the same way as in FIG. 1A, an about 0.10 μm thick i-type InGaAsP carrier recombination layer 602 having a bandgap wavelength of about 1.20 μm and a p-type InP layer 603 are sequentially grown by a MOVPE process on a (100) n-type InP substrate 601. Then, a silicon dioxide layer is deposited by a CVD process on the entire surface, and the silicon dioxide layer is patterned by a photolithography and etching process. As a result, a silicon dioxide pattern 604 having an about 1.5 μm wide-striped space is formed along the direction [011] of the n-type InP substrate 601.

Figure 11B:
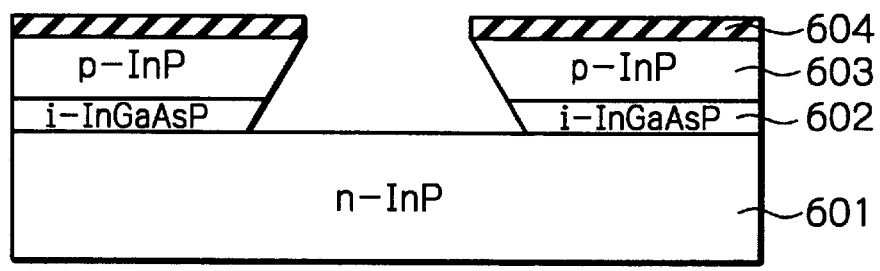

Next, referring to FIG. 11B, in the same way as in FIG. 1B, the P-type InP layer 603 and the i-type InGaAsP carrier recombination layer 602 are etched by a wet etching process using the silicon dioxide pattern 604 as a mask.

Figure 11C:
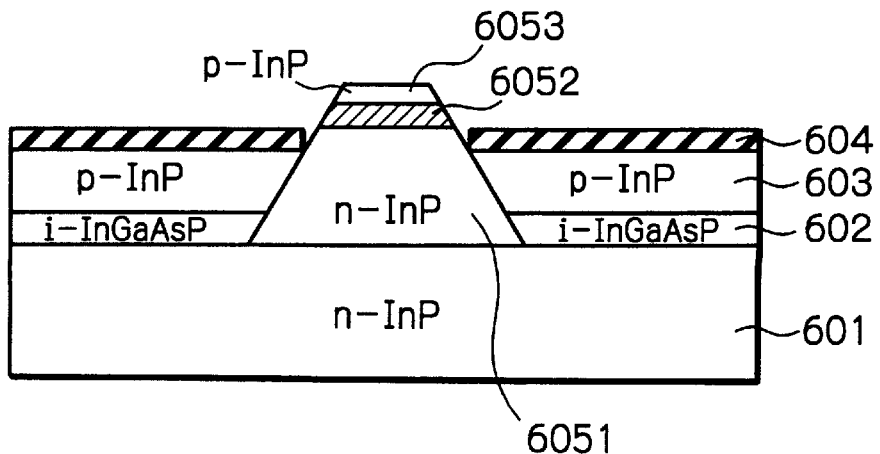

Next, referring to FIG. 11C, in a similar way to that of FIG. 1C, an n-type InP layer 6051, an MQW active layer 6052 consisting of four periods of one about 4 nm thick $In_{0.767}Ga_{0.233}As_{0.808}P_{0.192}$ well layer and one about 10 nm thick $In_{0.760}Ga_{0.240}As_{0.511}P_{0.489}$ barrier layer and an n-type InP layer 6053 are selectively and sequentially grown by an MOVPE process using the silicon dioxide pattern 604 as a mask. In this case, the MQW active layer 606 has a photoluminescence wavelength of 1.45 μm. Then, the silicon dioxide pattern 604 is removed.

Figure 11D:
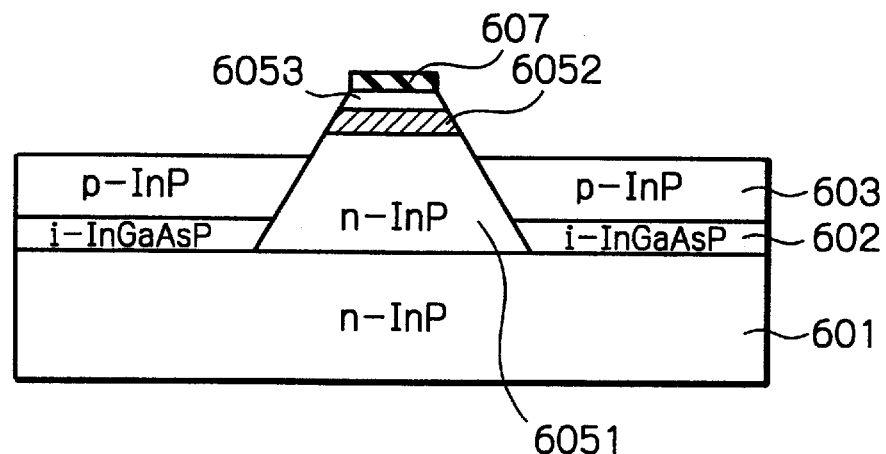

Next, referring to FIG. 11D, in the same way as in FIG. 1D, a silicon dioxide layer is deposited by a CVD process on the entire surface, and the silicon dioxide layer is patterned by a self-alignment process. As a result, a silicon dioxide pattern 607 is formed only on the p-type InP layer 6053, i.e., only on a mesa structure.

Figure 11E:
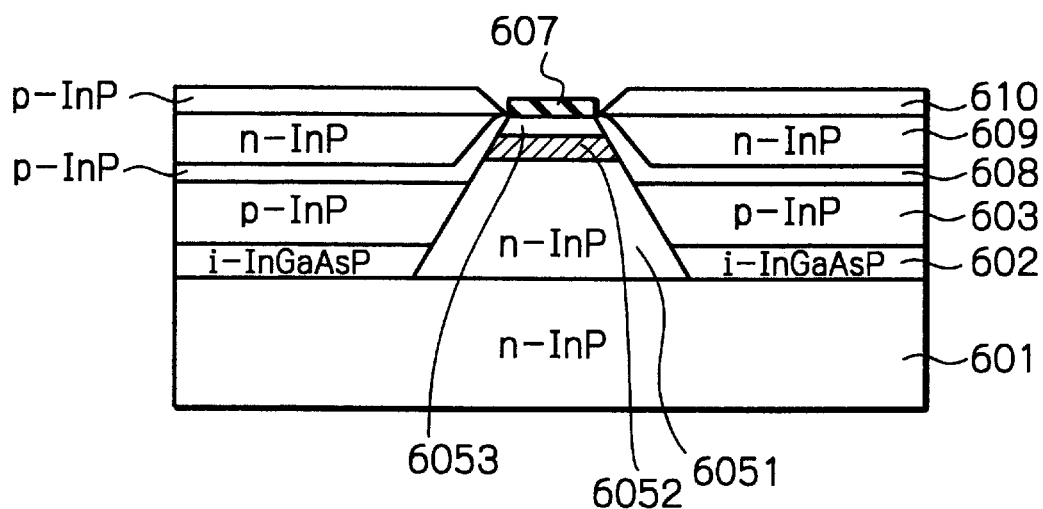

Next, referring to FIG. 11E, in the same way as in FIG. 1E, a p-type InP layer 608, an n-type InP layer 609 and a p-type InP layer 610 are sequentially grown by an MOVPE process using the silicon dioxide pattern 607 as a mask. Note that the p-type InP layer 608, the n-type InP layer 609 and the p-type InP layer 610 form a current blocking layer. Then, the silicon dioxide pattern 607 is removed.

Figure 11F:
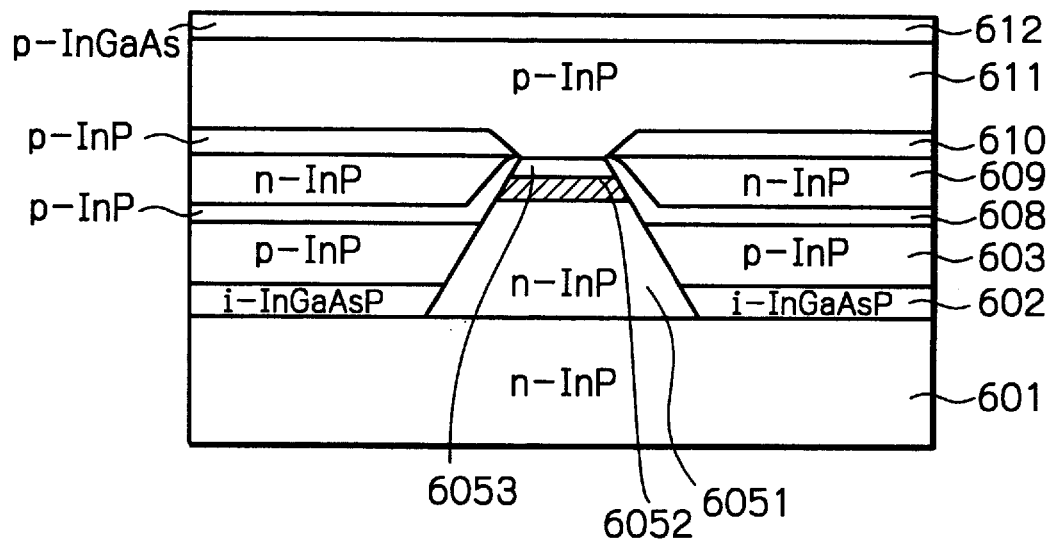

Next, referring to FIG. 11F, in the same way as in FIG. 1F, a p-type InP clad layer 611 and a p-type InGaAs cap layer 612 are sequentially grown by an MOVPE process.

Figure 11G:
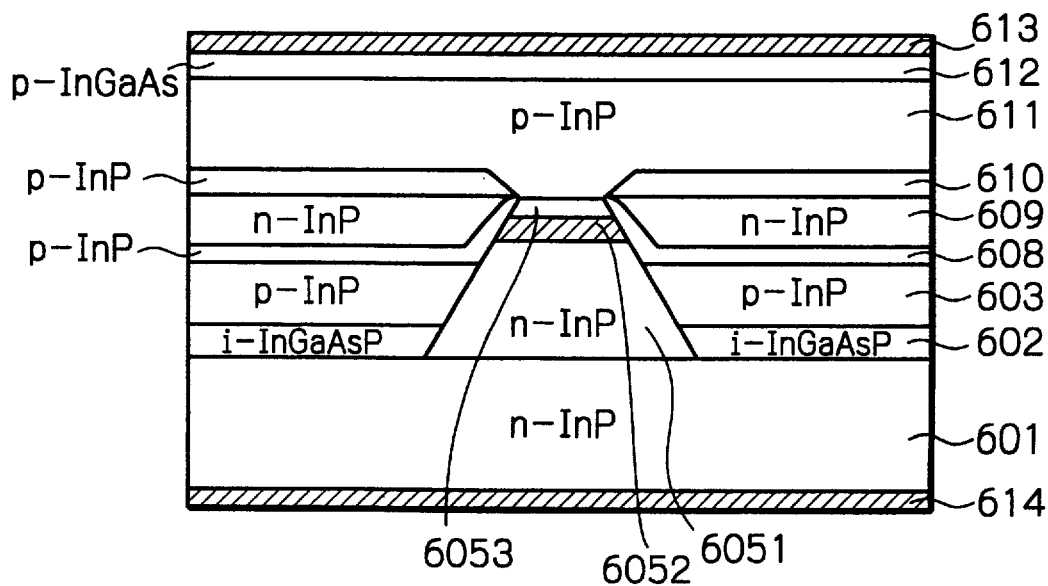
Figure 12:
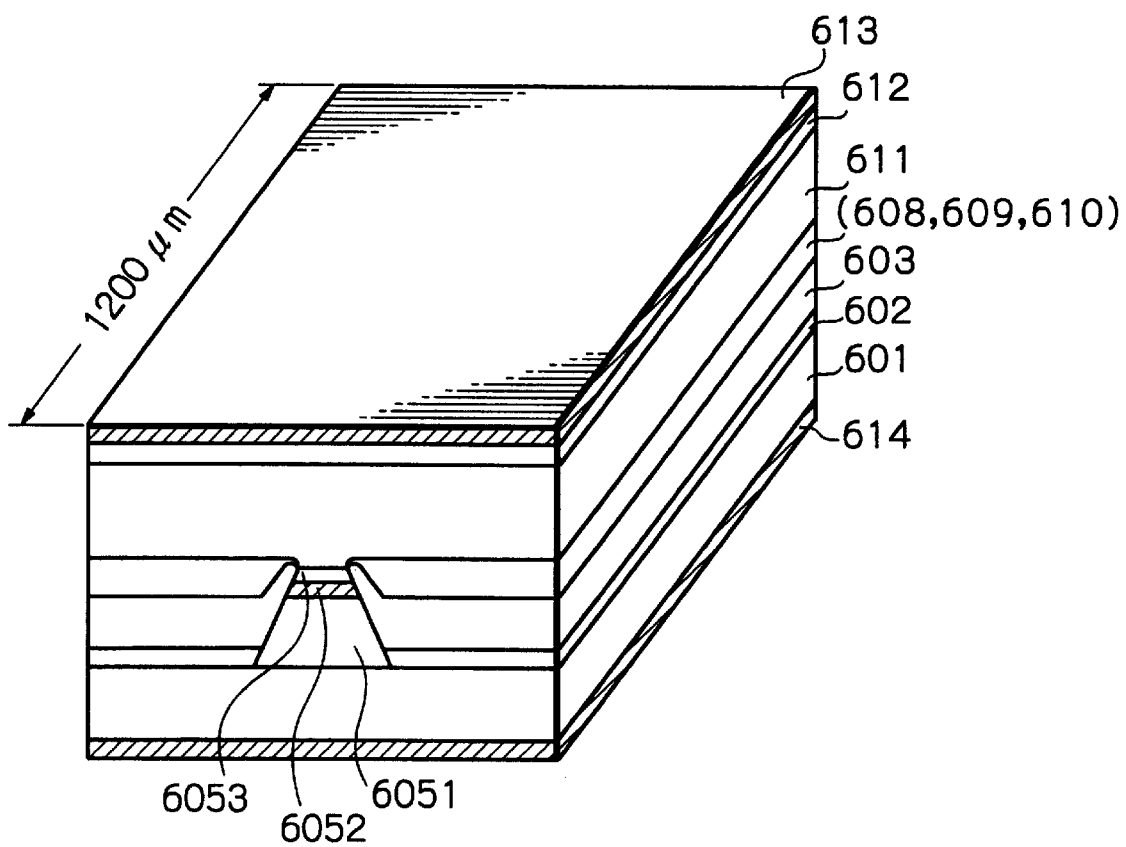
FIG. 12 is a perspective view illustrating the semiconductor laser device obtained by the method as illustrated in FIG. 11A through 11G.

Finally, referring to FIG. 11G, in the same way as in FIG. 1G, a p-side electrode 613 and an n-side electrode 614 are formed on the front and back surfaces, respectively, thus completing a semiconductor laser device as illustrated in FIG. 12.

The semiconductor laser device of FIG. 12 is cut so that its length is 1200 μm. Also, a 96 percent high reflection layer (not shown) is coated on a rear end facet, and a 4 percent low reflection layer is coated on a front end facet. Further, an AlN heat sink (not shown) is adhered to the semiconductor laser device of FIG. 12. In this case, the following laser characteristics were obtained:

1) The threshold current at 25° C. was 22 mA and the slope efficiency at 25° C. was 0.53 W/A.

2) The light output at 500 mA current infection mode was 240 mW, and the maximum light output was 395 mW at 1600 mA current injection mode, which exhibited a large light output.

Although the above-described embodiments relate to InGaAsP semiconductor laser 'devices, the present invention can applied to III–V semiconductor laser devices and II–VI semiconductor laser devices such as InGaAlAs, GaN, InSb and ZnSSe semiconductor laser devices. Also, the present invention can be applied to buried heterostructured (BH) optical waveguide devices such as optical modulators, optical amplifiers and optical switches.

As explained hereinabove, according to the present invention, since the structure of the carrier recombination layer is different from that of the active layer, the energy gap of the carrier recombination layer can be wider than that of the active layer. As a result the leakage current to the carrier recombination layer can be suppressed, which can decrease the leakage current at a high temperature and a high bias condition. Thus, a low threshold current operation and a high efficient operation can be carried out.

What is claimed is:

1. A method for manufacturing an optical semiconductor device, comprising the steps of:

sequentially growing an i-type carrier recombination layer and a first semiconductor layer of a first conductivity type by a metal-organic vapor epitaxy (MOVPE) process on a semiconductor substrate of a second conductivity type;

forming a first mask pattern having a striped space on said first semiconductor layer;

etching said first semiconductor layer and said i-type carrier recombination layer by using said first mask pattern;

sequentially growing a second semiconductor layer of said second conductivity type, a multiple quantum well active layer and a third semiconductor layer of said first conductivity type by an MOVPE process using said first mask pattern on said semiconductor substrate;

removing said first mask pattern after said second semiconductor layer, said multiple quantum well active layer and said third semiconductor layer are grown;

forming a second mask pattern only on said third semiconductor layer after said first mask pattern is removed;

sequentially growing a fourth semiconductor layer of said first conductivity type, a fifth semiconductor layer of said second conductivity type and a sixth semiconductor layer of said first conductivity type by an MOVPE process using said second mask pattern;

removing said second mask pattern after said fourth, fifth and sixth semiconductor layers are grown; and sequentially growing a seventh semiconductor layer of said first conductivity type and a semiconductor cap layer of said first conductivity type by an MOVPE process after said second mask pattern is removed.

2. The method as set forth in claim 1, wherein said semiconductor substrate and said second and fifth semiconductor layers are made of n-type InP, said first, third, fourth, fifth, sixth and seventh semiconductor layers being made of p-type InP, said i-type carrier recombination layer being made of i-type InGaAsP, said semiconductor cap layer being made of p-type InGaAs.

* * * * *